United States Patent
Min et al.

(10) Patent No.: US 12,355,010 B2
(45) Date of Patent: Jul. 8, 2025

(54) LIGHT-EMITTING DEVICE, METHOD FOR MANUFACTURING SAME, AND DISPLAY DEVICE COMPRISING SAME

(71) Applicant: SAMSUNG DISPLAY CO., LTD., Yongin-si (KR)

(72) Inventors: Jung Hong Min, Yongin-si (KR); Dae Hyun Kim, Yongin-si (KR); Hyun Deok Im, Yongin-si (KR); Hyun Min Cho, Yongin-si (KR); Jong Hyuk Kang, Yongin-si (KR); Dong Uk Kim, Yongin-si (KR); Bek Hyun Lim, Yongin-si (KR); Jae Ik Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 808 days.

(21) Appl. No.: 17/258,992

(22) PCT Filed: Dec. 13, 2018

(86) PCT No.: PCT/KR2018/015847
§ 371 (c)(1),
(2) Date: Jan. 8, 2021

(87) PCT Pub. No.: WO2020/013403
PCT Pub. Date: Jan. 16, 2020

(65) Prior Publication Data
US 2021/0305222 A1    Sep. 30, 2021

(30) Foreign Application Priority Data
Jul. 9, 2018  (KR) ........................ 10-2018-0079548

(51) Int. Cl.
*H01L 25/07*    (2006.01)
*H01L 25/075*   (2006.01)
(Continued)

(52) U.S. Cl.
CPC ......... *H01L 25/0753* (2013.01); *H10D 86/40* (2025.01); *H10D 86/60* (2025.01);
(Continued)

(58) Field of Classification Search
CPC . H01L 25/0753; H01L 27/1214; H01L 33/24; H01L 33/405; H01L 33/62; H01L 2933/0066
(Continued)

(56) References Cited

U.S. PATENT DOCUMENTS 8,872,214 B2    10/2014  Negishi et al.
9,190,590 B2*   11/2015  Shibata ............... H01L 31/0547
(Continued)

FOREIGN PATENT DOCUMENTS

JP    4814394    11/2011
JP    4914929     4/2012
(Continued)

OTHER PUBLICATIONS

Written Opinion, with English translation, corresponding to International Application No. PCT/KR2018/015847, dated Apr. 5, 2019.
(Continued)

*Primary Examiner* — Ori Nadav
(74) *Attorney, Agent, or Firm* — KILE PARK REED & HOUTTEMAN PLLC

(57) ABSTRACT

A light emitting device may include a first electrode disposed on a substrate, and a second electrode spaced apart from the first electrode, the first electrode and the second electrode being disposed on a same layer; an insulating pattern disposed between the first electrode and the second electrode, and overlapping a portion of the first electrode and a portion of the second electrode; and at least one light emitting element disposed on the insulating pattern, and including a first end and a second end in a longitudinal
(Continued)

direction of the at least one light emitting element; a first bank disposed on the first electrode, and a second bank disposed on the second electrode; a first reflective electrode disposed on the first bank and electrically connected with the first electrode; and a second reflective electrode disposed on the second bank and electrically connected with the second electrode.

14 Claims, 24 Drawing Sheets

(51) Int. Cl.
  *H10D 86/40* (2025.01)
  *H10D 86/60* (2025.01)
  *H10H 20/821* (2025.01)
  *H10H 20/832* (2025.01)
  *H10H 20/857* (2025.01)
  *H10H 20/01* (2025.01)

(52) U.S. Cl.
  CPC ........ *H10H 20/821* (2025.01); *H10H 20/835* (2025.01); *H10H 20/857* (2025.01); *H10H 20/0364* (2025.01)

(58) Field of Classification Search
  USPC .......................................... 257/89
  See application file for complete search history.

(56) References Cited

U.S. PATENT DOCUMENTS

| | | | |
|---|---|---|---|
| 9,287,242 B2 | 3/2016 | Shibata et al. | |
| 9,570,425 B2 | 2/2017 | Do | |
| 9,773,761 B2 | 9/2017 | Do | |
| 10,026,777 B2 | 7/2018 | Kang et al. | |
| 10,211,418 B2 | 2/2019 | Im et al. | |
| 10,340,419 B2 | 7/2019 | Kim et al. | |
| 10,367,123 B2 | 7/2019 | Im et al. | |
| 10,461,123 B2 | 10/2019 | Kim et al. | |
| 11,367,823 B2* | 6/2022 | Kim | H01L 27/1259 |
| 11,600,756 B2* | 3/2023 | Kim | H01L 33/62 |
| 11,742,460 B2* | 8/2023 | Lee | H01L 25/0753 257/79 |
| 2011/0089850 A1 | 4/2011 | Shibata et al. | |
| 2014/0213004 A1* | 7/2014 | Yamazaki | H10K 50/841 438/26 |
| 2014/0264315 A1* | 9/2014 | Ono | H10K 59/122 257/40 |
| 2015/0115293 A1* | 4/2015 | Wu | H01L 27/156 438/28 |
| 2017/0170373 A1* | 6/2017 | Peng | H01L 27/1248 |
| 2017/0317228 A1 | 11/2017 | Sung | |
| 2018/0175009 A1* | 6/2018 | Kim | H01L 33/20 |
| 2018/0287010 A1 | 10/2018 | Sung | |
| 2019/0019930 A1 | 1/2019 | Do et al. | |
| 2021/0159250 A1* | 5/2021 | Chang | H01L 27/124 |
| 2021/0265329 A1* | 8/2021 | Woo | H01L 25/0753 |
| 2021/0280632 A1* | 9/2021 | Kim | H01L 33/40 |
| 2021/0288033 A1* | 9/2021 | Lim | H01L 33/08 |
| 2021/0358393 A1* | 11/2021 | Kang | H01L 33/62 |
| 2021/0376196 A1* | 12/2021 | Lee | H01L 33/62 |
| 2022/0013693 A1* | 1/2022 | Cho | H01L 33/0093 |

FOREIGN PATENT DOCUMENTS

| | | |
|---|---|---|
| KR | 10-1436123 | 11/2014 |
| KR | 10-1490758 | 2/2015 |
| KR | 10-1672781 | 11/2016 |
| KR | 10-1711187 | 3/2017 |
| KR | 10-1713818 | 3/2017 |
| KR | 10-2018-0007025 | 1/2018 |
| KR | 10-2018-0009014 | 1/2018 |
| KR | 10-2018-0009015 | 1/2018 |
| KR | 10-2018-0055021 | 5/2018 |
| KR | 10-2018-0071465 | 6/2018 |
| KR | 10-2018-0072909 | 7/2018 |

OTHER PUBLICATIONS

International Search Report corresponding to International Application No. PCT/KR2018/015847, dated Apr. 5, 2019.
Korean Notice of Allowance, with English Translation, for Korean Patent Application No. 10-2018-0079548, dated Aug. 17, 2023.

* cited by examiner

LIGHT-EMITTING DEVICE, METHOD FOR MANUFACTURING SAME, AND DISPLAY DEVICE COMPRISING SAME

CROSS-REFERENCE TO RELATED APPLICATION(S)

This application is a national entry of International Application No. PCT/KR2018/015847, filed on Dec. 13, 2018, which claims under 35 U.S.C. §§ 119(a) and 365(b) priority to and benefits of Korean Patent Application No. 10-2018-0079548, filed on Jul. 9, 2018 in the Korean Intellectual Property Office, the entire contents of which are incorporated herein by reference.

BACKGROUND

1. Technical Field

Various embodiments of the disclosure relate to a light emitting device, a method of fabricating the light emitting device, and a display device having the light emitting device.

2. Description of Related Art

A light emitting diode (LED) may have relatively satisfactory durability even under poor environmental conditions and may have excellent performances in terms of lifetime and luminance.

To apply the LED to a lighting device, a display device, or the like, there is a need to electrically connect the LED to an electrode so that the voltage of the power supply may be applied to the LED. With regard to application purposes of the LED, a method of reducing space needed for the electrode, or a method of fabricating the LED, various research on arrangement relationship between the LED and the electrode have been conducted.

Arrangement schemes of the LED and the electrode may be classified into a scheme of directly growing the LED on the electrode, and a scheme of independently growing the LED and then disposing the LED on the electrode.

In the case of the latter scheme, in case that the LED is a nanoscale subminiature diode, there is a problem, among others, in that it is difficult to dispose the LED on the electrode.

SUMMARY

Various embodiments of the disclosure are directed to a light emitting device in which alignment defects of subminiature light emitting diodes can be prevented and the light emitting efficiency of the subminiature light emitting diodes can be enhanced, a method of fabricating (or manufacturing) the light emitting device, and a display device having the light emitting device.

According to an aspect of the disclosure, a light emitting device may include a first electrode disposed on a substrate; and a second electrode spaced apart from the first electrode, the first electrode and the second electrode being disposed on a same layer; an insulating pattern disposed between the first electrode and the second electrode and overlapping with each of a portion of the first electrode and a portion of the second electrode; at least one light emitting element disposed on the insulating pattern, and including a first end and a second end with respect to a longitudinal direction of the at least one light emitting element; a first bank (or first partition wall), disposed on the first electrode; a second bank (or second partition wall), disposed on the second electrode; a first reflective electrode disposed on the first bank and electrically connected with the first electrode; and a second reflective electrode disposed on the second bank and electrically connected with the second electrode.

In an embodiment of the disclosure, in a plan view, the insulating pattern may have a width greater than a length of the at least one light emitting element.

In an embodiment of the disclosure, in a plan view, the insulating pattern is disposed between the first bank and the second bank which are spaced apart from each other.

In an embodiment of the disclosure, a height of each of the first bank and the second bank may be equal to or greater than the length of the at least one light emitting element.

In an embodiment of the disclosure, the width of the insulating pattern may be less than a distance between the first reflective electrode and the second reflective electrode and greater than the distance between the first electrode and the second electrode.

In an embodiment of the disclosure, the first reflective electrode and the second reflective electrode may be disposed on a same layer and spaced apart from each other.

In an embodiment of the disclosure, the light emitting device may further include: a first contact electrode disposed on the first reflective electrode, and the first contact electrode electrically connecting the first end of the at least one light emitting element with the first reflective electrode; and a second contact electrode disposed on the second reflective electrode, the second contact electrode electrically connecting the second end of the at least one light emitting element with the second reflective electrode.

In an embodiment of the disclosure, the at least one light emitting element may include: a first semiconductor layer (or first conductive semiconductor layer) doped with a first conductive dopant; a second semiconductor layer (or second conductive semiconductor layer) doped with a second conductive dopant; and an active layer disposed between the first semiconductor layer and the second semiconductor layer.

In an embodiment of the disclosure, the at least one light emitting element may include a light emitting diode having a shape of a cylinder or polyprism and having a micro-scale or nano-scale size.

The light emitting device may be fabricated by a method including forming a first electrode and a second electrode on a substrate, the first electrode and the second electrode being spaced apart from each other and being disposed on a same layer; forming an insulating material layer on the first and second electrodes; forming an insulating pattern overlapping a portion of the first electrode and a portion of the second electrodes by removing a portion of the insulating material layer; supplying a solution in which a plurality of light emitting elements are dispersed onto the insulating pattern; aligning the plurality of light emitting elements on the insulating pattern between the first electrode and the second electrode by forming an electric field between the first electrode and the second electrode; forming a first bank on the first electrode; forming a second bank on the second electrode; forming, on the first bank, a first reflective electrode electrically connected with the first electrode; and forming, on the second bank, a second reflective electrode electrically connected with the second electrode.

In an embodiment of the disclosure, the forming of the insulating pattern may comprise performing a mask process with respect to the insulating material layer such that the insulating pattern has a width greater than a length of each of the plurality of light emitting elements and overlaps a portion of the first electrode and a portion of second electrode.

In an embodiment of the disclosure, the method may further comprise forming, on the first reflective electrode, a first contact electrode electrically connecting an end of each of the plurality of light emitting elements with the first reflective electrode; and forming, on the second reflective electrode, a second contact electrode electrically connecting another end of each of the plurality of light emitting elements with the second reflective electrode.

According to an aspect of the disclosure, a display device may include a substrate including a display area and a non-display area; and a plurality of pixels disposed in the display area, and including at least one sub-pixel.

In an embodiment of the disclosure, the at least one sub-pixel may include a pixel circuit layer including at least one transistor, and a display element layer including at least one light emitting element electrically connected to the pixel circuit layer.

In an embodiment of the disclosure, the display element layer may include a first electrode disposed on the pixel circuit layer and extending in a first direction; a second electrode spaced apart from the first electrode, the first electrode and the second electrode being disposed on a same layer; an insulating pattern disposed between the first electrode and the second electrode, and overlapping a portion of the first electrode and a portion of the second electrode; the at least one light emitting element disposed on the insulating pattern, and including a first end and a second end in a longitudinal direction of the at least one light emitting element; a first bank disposed on the first electrode; a second bank provided on the second electrode; a first reflective electrode disposed on the first bank and electrically connected with the first electrode; and a second reflective electrode disposed on the second bank and electrically connected with the second electrode.

In an embodiment of the disclosure, in a plan view, the insulating pattern may have a width greater than a length of the at least one light emitting element.

In an embodiment of the disclosure, in a plan view, the insulating pattern may be disposed between the first bank and the second bank which are spaced apart from each other.

In an embodiment of the disclosure, a height of each of the first bank and the second bank may be equal to or greater than the length of the at least one light emitting element.

In an embodiment of the disclosure, the width of the insulating pattern may be less than a distance between the first reflective electrode and the second reflective electrode and greater than a distance between the first electrode and the second electrode.

In an embodiment of the disclosure, the first reflective electrode and the second reflective electrode are disposed on a same layer and spaced apart from each other.

In an embodiment of the disclosure, the display element layer may comprise a first contact electrode disposed on the first reflective electrode, the first contact electrode electrically connecting the first end of the at least one light emitting element with the first reflective electrode; and a second contact electrode disposed on the second reflective electrode, the second contact electrode electrically connecting the second end of the at least one light emitting element with the second reflective electrode.

In an embodiment of the disclosure, the display element layer may comprise a first connection line extending in a second direction intersecting the first direction and electrically connected with the first electrode; and a second connection line extending in a direction parallel to the first connection line and electrically connected with the second electrode.

Various embodiments of the disclosure may provide a light emitting device in which a subminiature light emitting element is disposed on an electrode for alignment and a reflective electrode electrically connected to the light emitting element is disposed on the electrode, whereby alignment defects of the light emitting element may be minimized.

Furthermore, various embodiments of the disclosure may provide a light emitting device in which the light emitting efficiency of the light emitting element can be enhanced.

Various embodiments of the disclosure may provide a method of fabricating the light emitting device.

Various embodiments of the disclosure may provide a display device including the light emitting device.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1A:
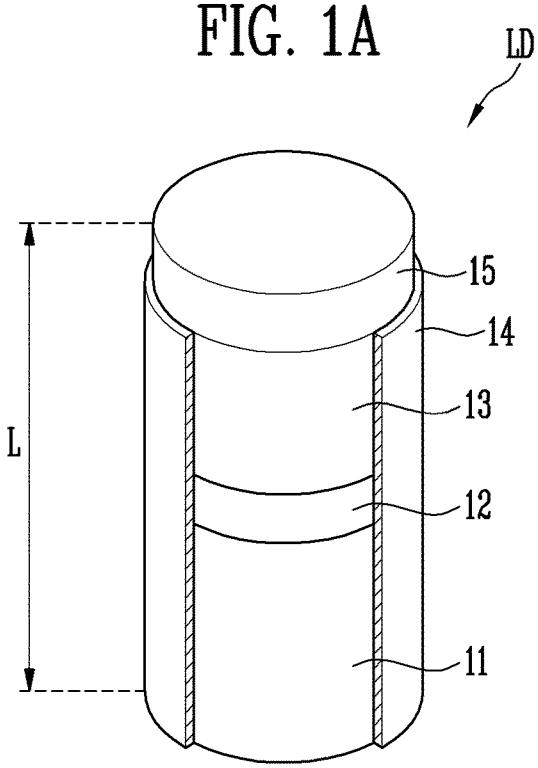
FIGS. 1A and 1B are schematic perspective views illustrating various types of light emitting elements in accordance with embodiments of the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise," "include," "have", and the like, when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

Embodiments of the disclosure will hereinafter be described in detail with reference to the accompanying drawings.

Figure 1B:
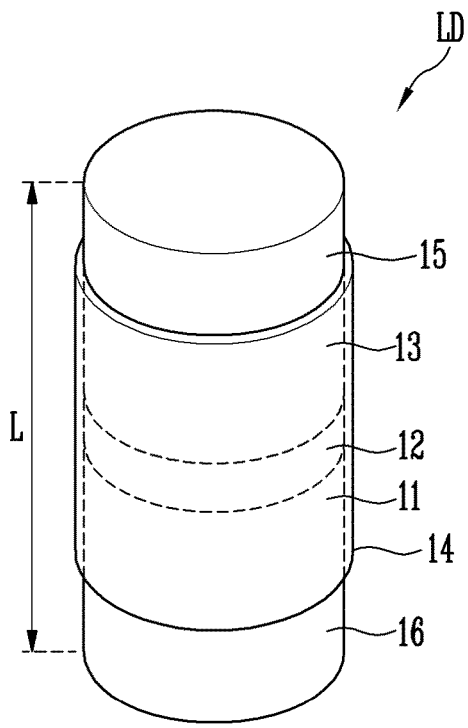

FIGS. 1A and 1B are perspective views illustrating various types of light emitting elements in accordance with embodiments of the disclosure. Although FIGS. 1A and 1B illustrate a cylindrical light emitting element, the disclosure is not limited thereto.

Referring to FIGS. 1A and 1B, the light emitting element LD in accordance with an embodiment of the disclosure may include a first conductive semiconductor layer 11, a second conductive semiconductor layer 13, and an active layer 12 interposed between the first and second conductive semiconductor layers 11 and 13.

For example, the light emitting element LD may be implemented as a stacked body formed by successively stacking the first conductive semiconductor layer 11, the active layer 12, and the second conductive semiconductor layer 13.

In an embodiment of the disclosure, the light emitting element LD may be provided in the form of a rod extending in one direction. If the direction in which the light emitting element LD extends is defined as a longitudinal direction, the light emitting element LD may have a first end and a second end in the longitudinal direction.

One of the first and second conductive semiconductor layers 11 and 13 may be disposed on the first end of the light emitting element LD, and the other of the first and second conductive semiconductor layers 11 and 13 may be disposed on the second end of the light emitting element LD.

Although the light emitting element LD may be provided in the form of a cylinder, the disclosure is not limited thereto. The light emitting element LD may have a rod-like shape or a bar-like shape extending in the longitudinal direction (i.e., to have an aspect ratio greater than 1). For example, a length L of the light emitting element LD may be greater than the diameter thereof.

The light emitting element LD may include a light emitting diode fabricated in a subminiature size having a diameter and/or length corresponding, e.g., to a micro-scale or nano-scale size.

However, the size of the light emitting element LD is not limited to this, and the size of the light emitting element LD may be changed to meet requirements of a lighting device or a self-emissive display device to which the light emitting element LD is applied.

The first conductive semiconductor layer 11 may include, e.g., at least one n-type semiconductor layer. For instance, the first conductive semiconductor layer 11 may include a semiconductor layer which includes any one semiconductor material of InAlGaN, GaN, AlGaN, InGaN, AlN, and InN, and is doped with a first conductive dopant such as Si, Ge, or Sn.

The material forming the first conductive semiconductor layer 11 is not limited to this, and the first conductive semiconductor layer 11 may be formed of various other materials.

The active layer 12 may be formed on the first conductive semiconductor layer 11 and have a single- or multi-quantum well structure. In an embodiment of the disclosure, a cladding layer (not shown) doped with a conductive dopant may be formed on and/or under the active layer 12. For example, the cladding layer may be formed of an AlGaN layer or an InAlGaN layer. Material such as AlGaN or AlInGaN may be employed to form the active layer 12.

If an electric field of a voltage equal to or greater than a predetermined voltage is applied to the opposite ends of the light emitting element LD, the light emitting element LD emits light by coupling of electron-hole pairs in the active layer 12.

The second conductive semiconductor layer 13 may be provided on the active layer 12 and may include a semiconductor layer of a type different from that of the first conductive semiconductor layer 11. For example, the second conductive semiconductor layer 13 may include at least one p-type semiconductor layer. For instance, the second conductive semiconductor layer 13 may include a semiconductor layer which includes any one semiconductor material of InAlGaN, GaN, AlGaN, InGaN, AlN, and InN, and is doped with a second conductive dopant such as Mg.

The material forming the second conductive semiconductor layer 13 is not limited to this, and the second conductive semiconductor layer 13 may be formed of various other materials.

In an embodiment of the disclosure, the light emitting element LD may further include an upper electrode layer 15 disposed on the second conductive semiconductor layer 13, as illustrated in FIG. 1A, as well as including the first conductive semiconductor layer 11, the active layer 12, and the second conductive semiconductor layer 13. In an embodiment, as shown in FIG. 1B, the light emitting element LD may further include a lower electrode layer 16 disposed on the first conductive semiconductor layer 11 as well as including the upper electrode layer 15.

Although each of the upper electrode layer 15 and the lower electrode layer 16 may be formed of an ohmic contact electrode, the disclosure is not limited thereto. The upper electrode layer 15 and the lower electrode layer 16 may include metal or a metal oxide. For example, chrome (Cr), titanium (Ti), aluminum (Al), gold (Au), nickel (Ni), ITO, and an oxide or alloy thereof may be used alone or in combination with each other. However, the disclosure is not limited to this.

Materials respectively included in the upper electrode layer 15 and the lower electrode layer 16 may be equal to or different from each other.

In an embodiment of the disclosure, the light emitting element LD may further include an insulating film 14. In an embodiment of the disclosure, the insulating film 14 may be omitted, or may be provided to cover only some of the first conductive semiconductor layer 11, the active layer 12, and the second conductive semiconductor layer 13.

As illustrated in FIG. 1A, the insulating film 14 may be provided on a portion of the light emitting element LD at least other than one end of the light emitting element LD. In this case, the upper electrode layer 15 of the light emitting element LD may be exposed.

As illustrated in FIG. 1B, the insulating film 14 may be provided on a portion of the light emitting element LD at least other than the opposite ends of the light emitting element LD. In this case, the upper electrode layer 15 and the lower electrode layer 16 of the light emitting element LD may be exposed.

Although in FIG. 1A there is illustrated the insulating film 14 from which a portion thereof has been removed for the sake of explanation, the actual light emitting element LD may be formed such that the entirety of the side surface of the cylindrical body thereof is enclosed by the insulating film 14.

The insulating film 14 may be provided to enclose at least a portion of an outer circumferential surface of the first conductive semiconductor layer 11, the active layer 12, and/or the second conductive semiconductor layer 13. For example, the insulating film 14 may enclose the outer circumferential surface of the active layer 12.

In an embodiment of the disclosure, the insulating film 14 may include a transparent insulating material. For example, the insulating film 14 may include at least one insulating material selected from the group consisting of SiO2, Si3N4, Al2O3, and TiO2, but it is not limited thereto. In other words, various materials having insulating properties may be employed.

If the insulating film 14 is provided on the light emitting element LD, the active layer 12 may be prevented from short-circuiting with a first and/or second electrode (not illustrated).

Thanks to the insulating film 14, occurrence of a defect on the surface of the light emitting element LD may be minimized, and the lifetime and efficiency of the light emitting element LD may be improved. In the case where multiple light emitting elements LD are disposed in close contact with each other, the insulating film 14 may prevent an undesired short-circuit from occurring between the light emitting elements LD.

The light emitting element LD may be employed as a light source for various display devices.

Figure 2A:
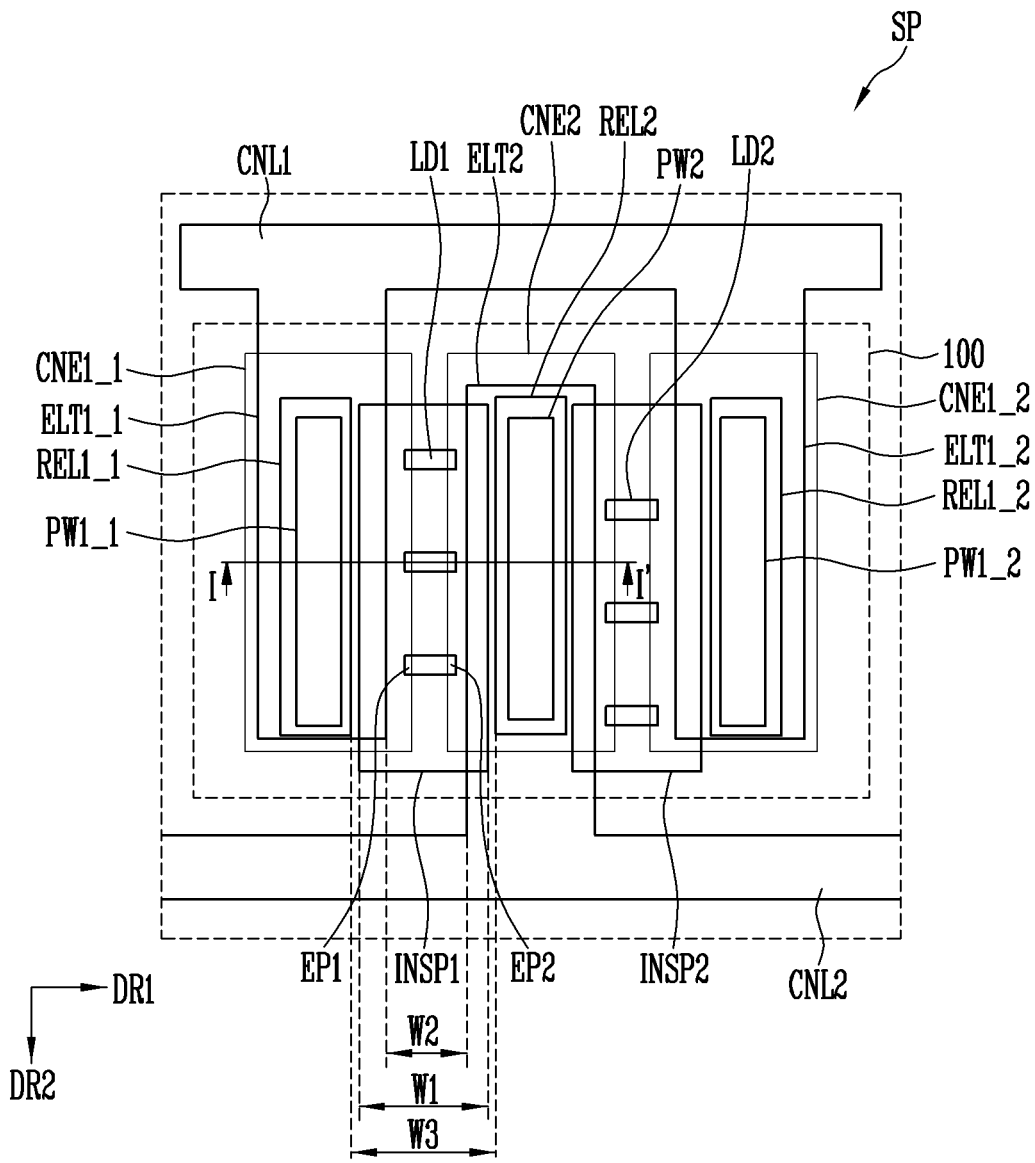
FIGS. 2A and 2B are schematic plan diagrams illustrating various shapes of unit emission areas of a light emitting device including the light emitting element of FIG. 1A.
Figure 2B:
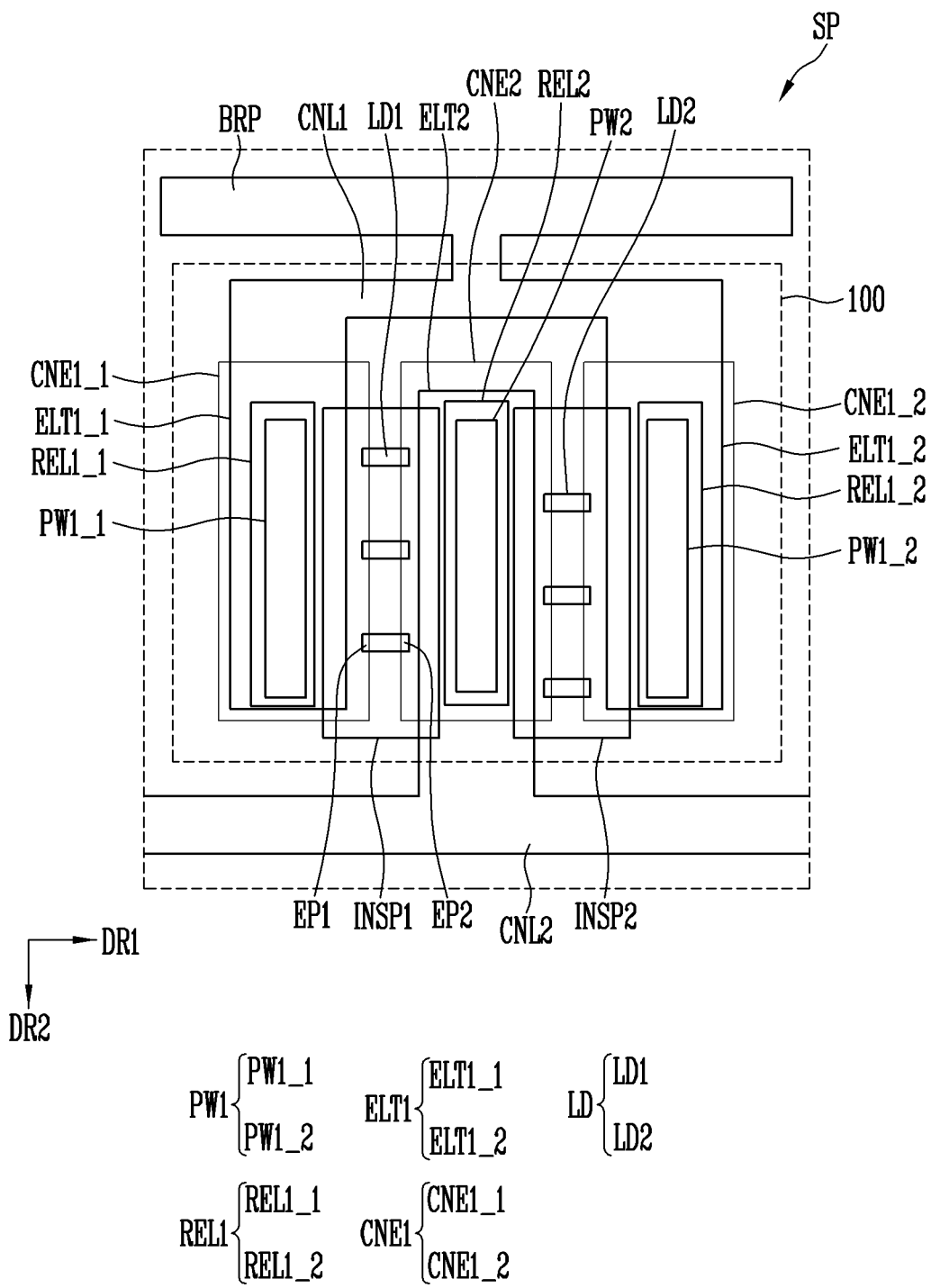
Figure 3A:
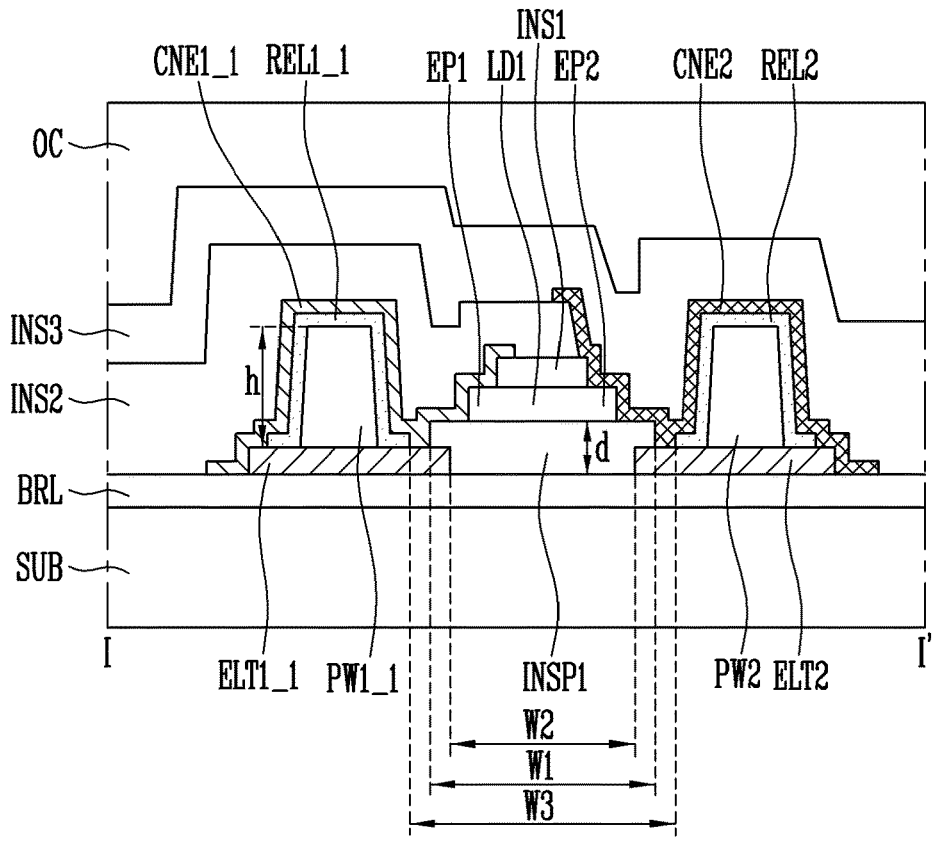
FIG. 3A is a schematic sectional view taken along line I-I' of FIG. 2A.
Figure 3B:
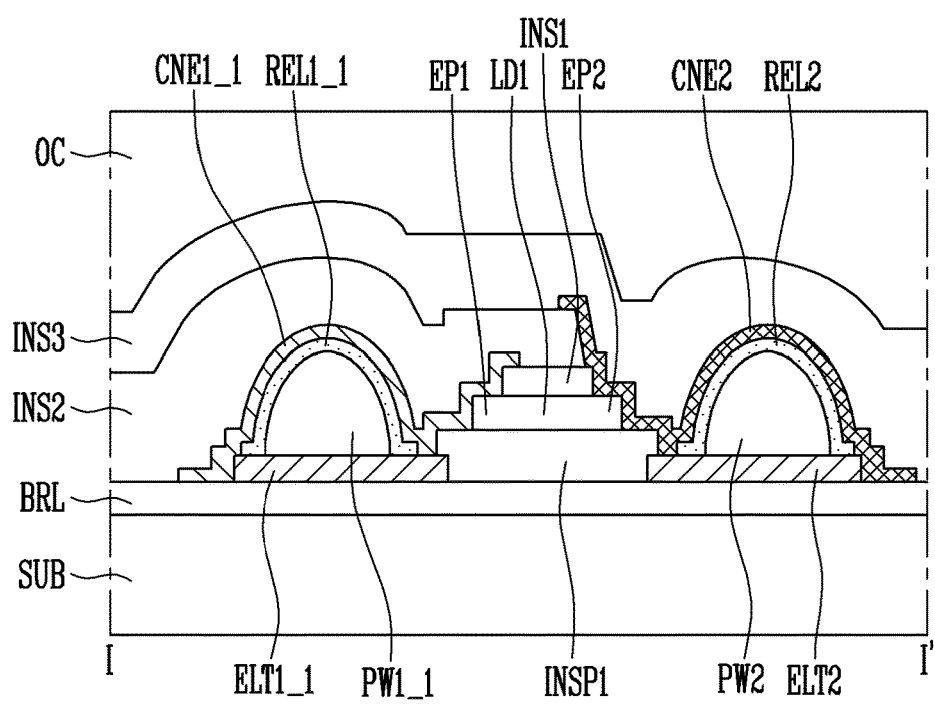
FIG. 3B illustrates a light emitting device in accordance with an embodiment of the disclosure and is a schematic sectional diagram corresponding to line I-I' of FIG. 2A.
Figure 4A:
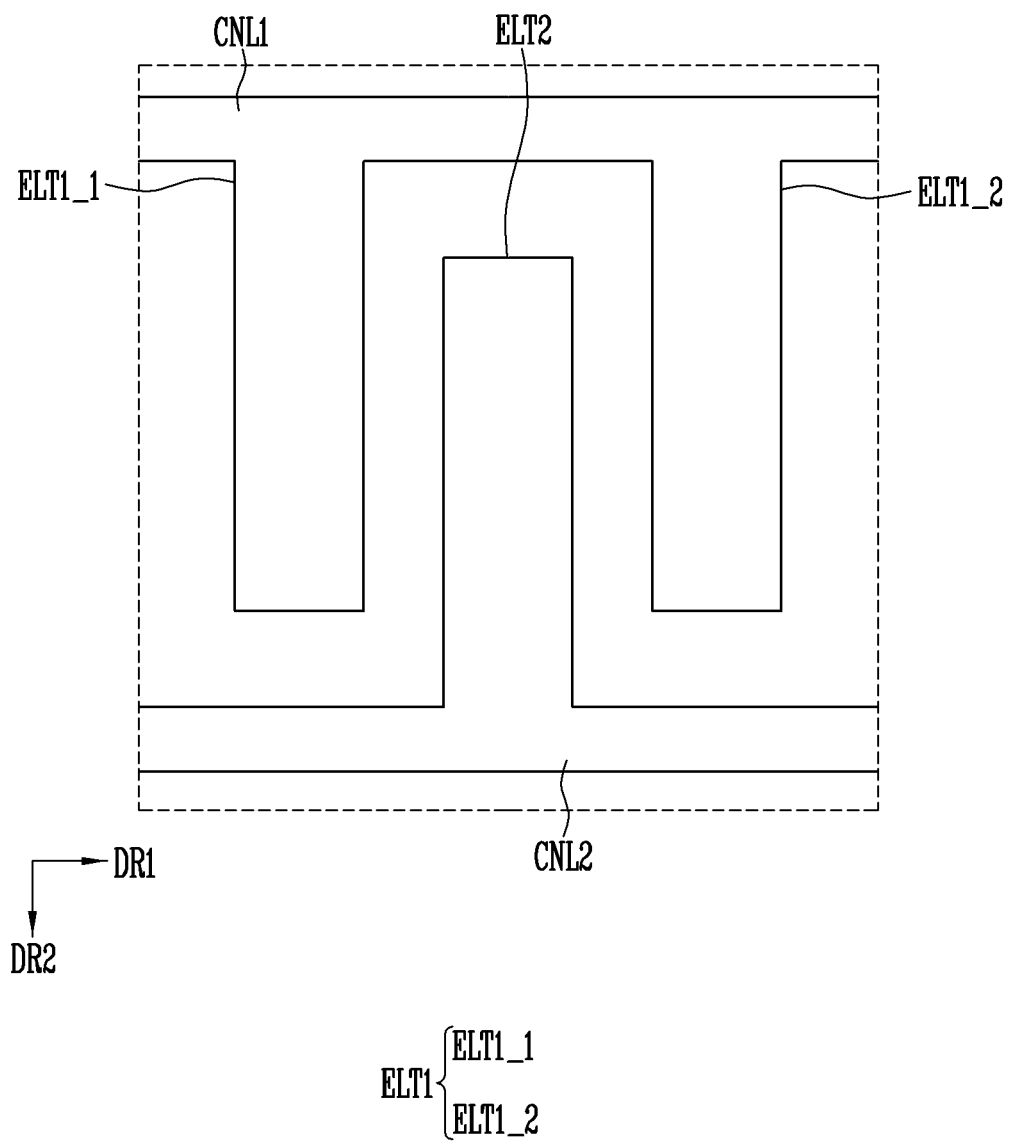
FIGS. 4A to 4G are schematic plan diagrams sequentially illustrating a method of fabricating the light emitting device of FIG. 2A.
Figure 4B:
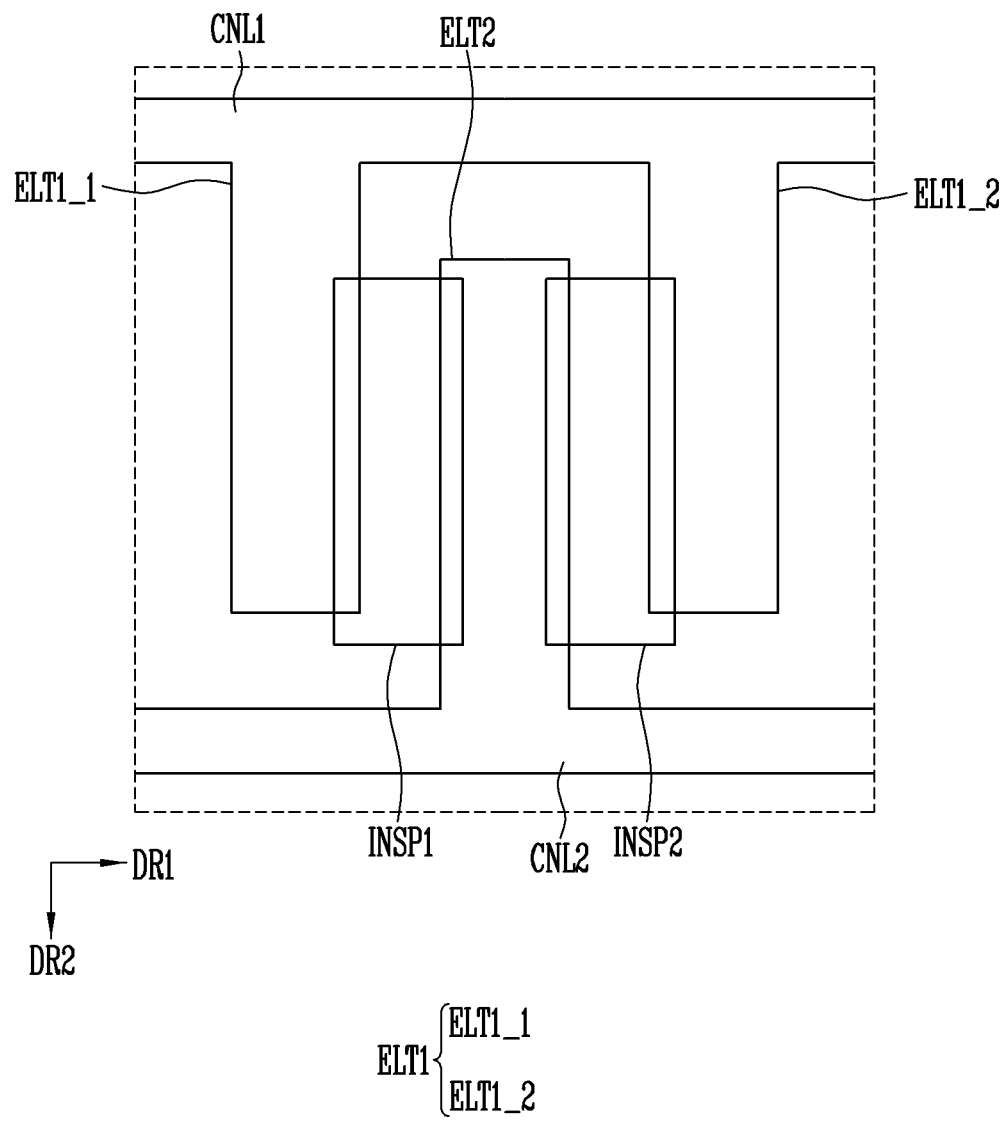
Figure 4C:
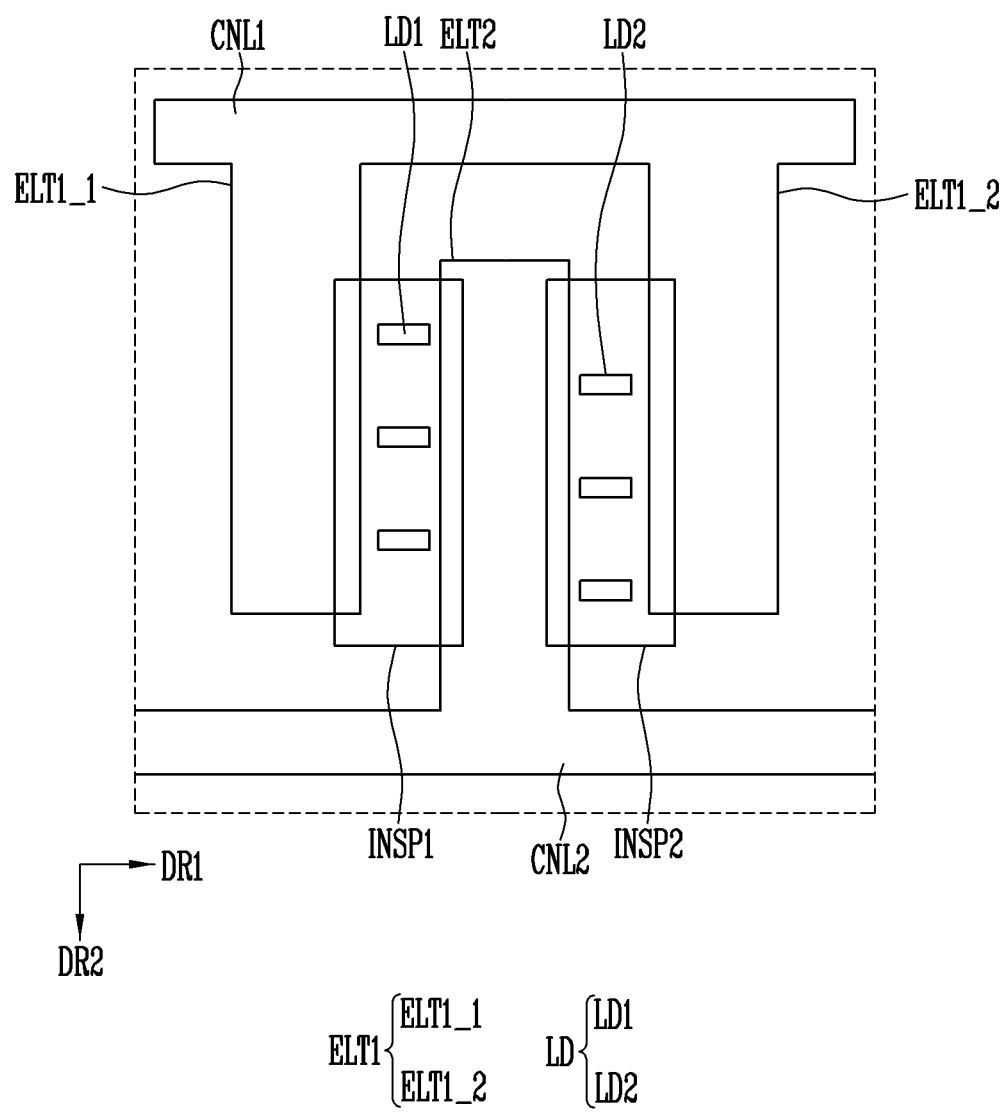
Figure 4D:
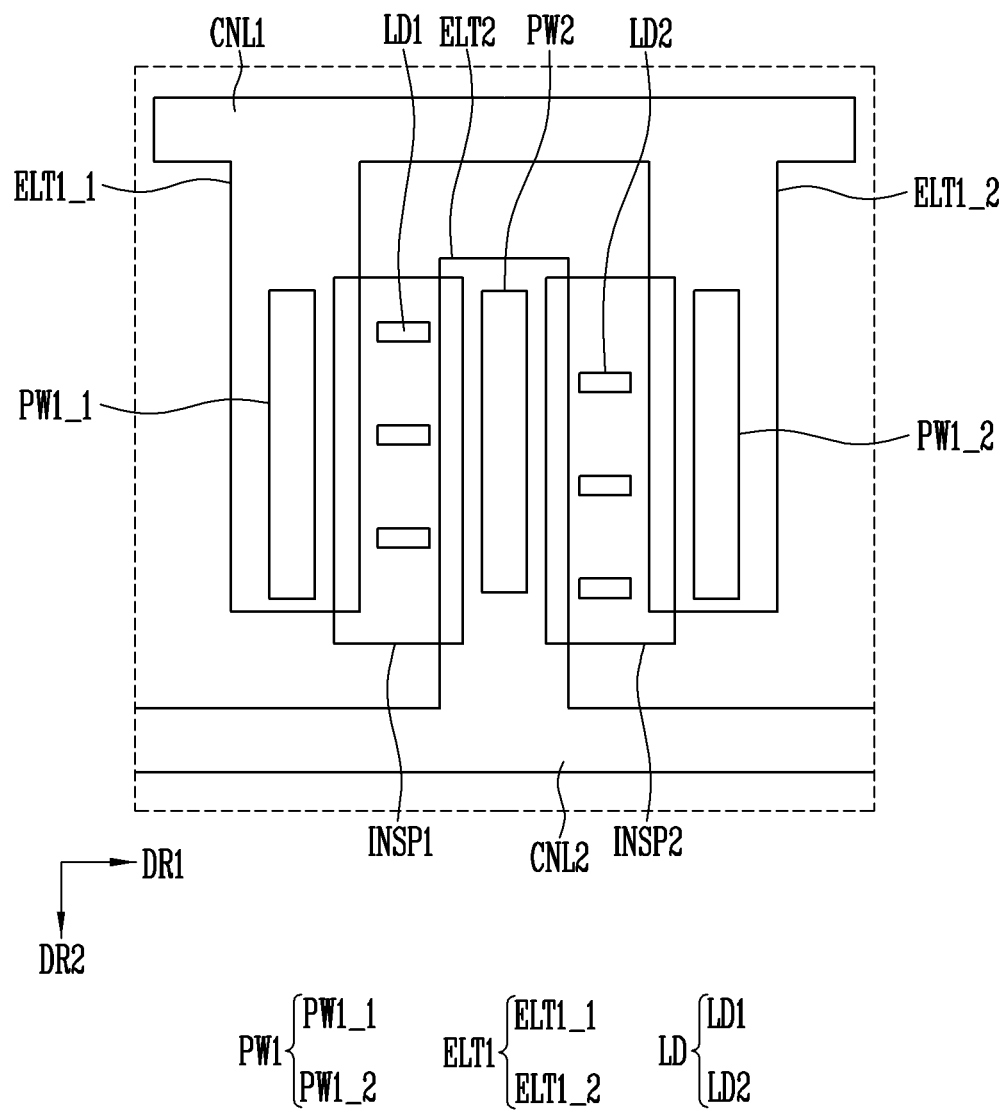
Figure 4E:
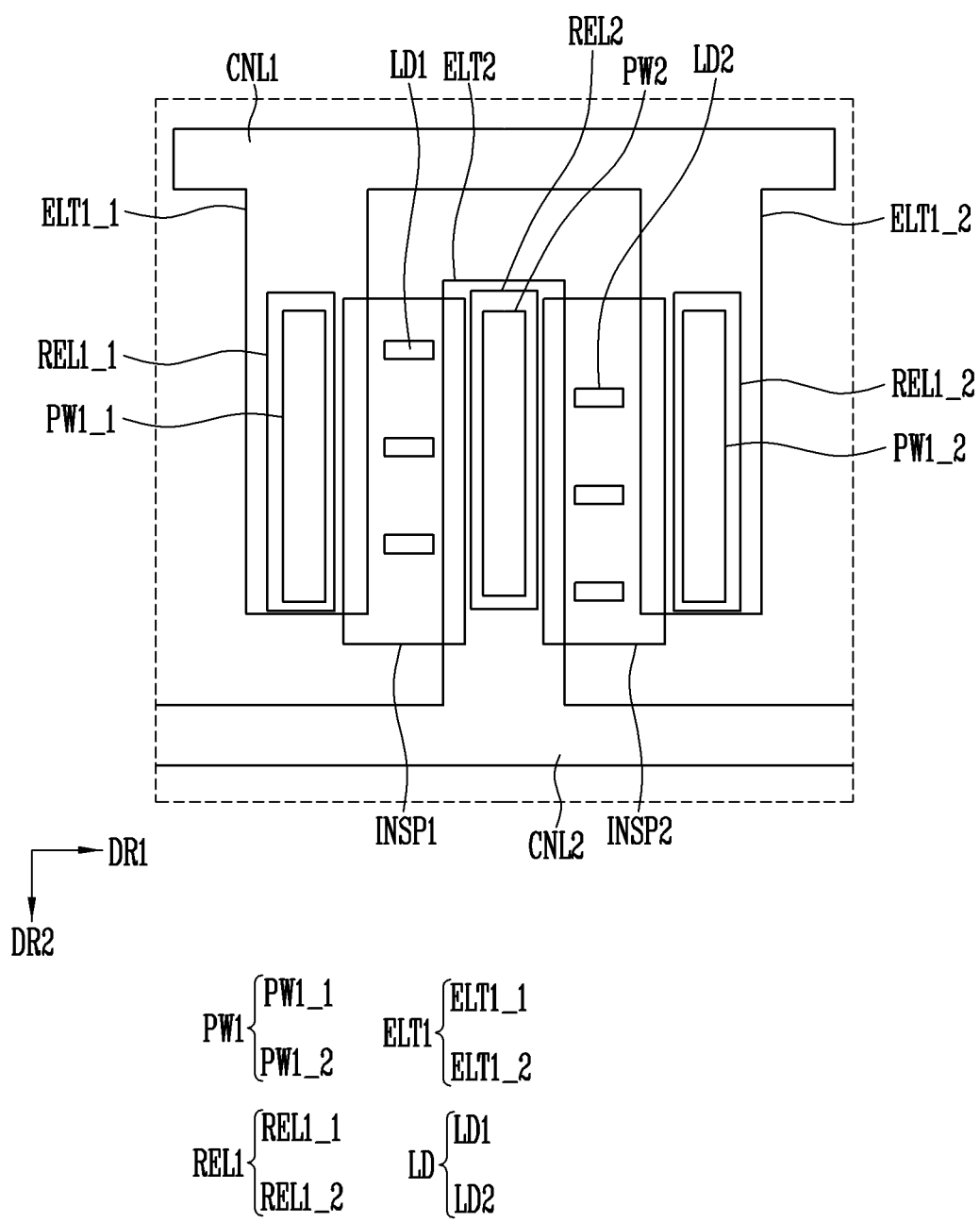
Figure 4F:
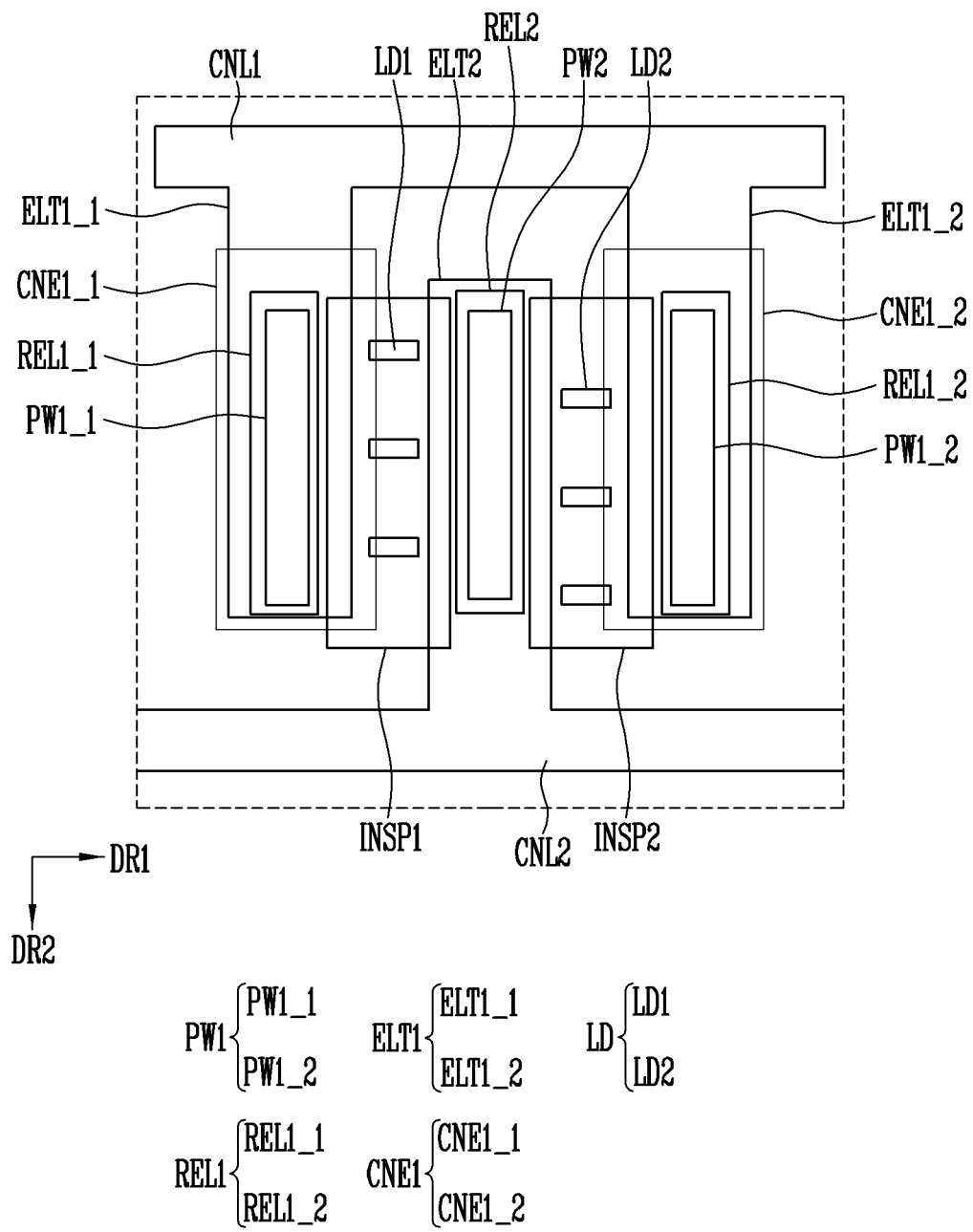
Figure 4G:
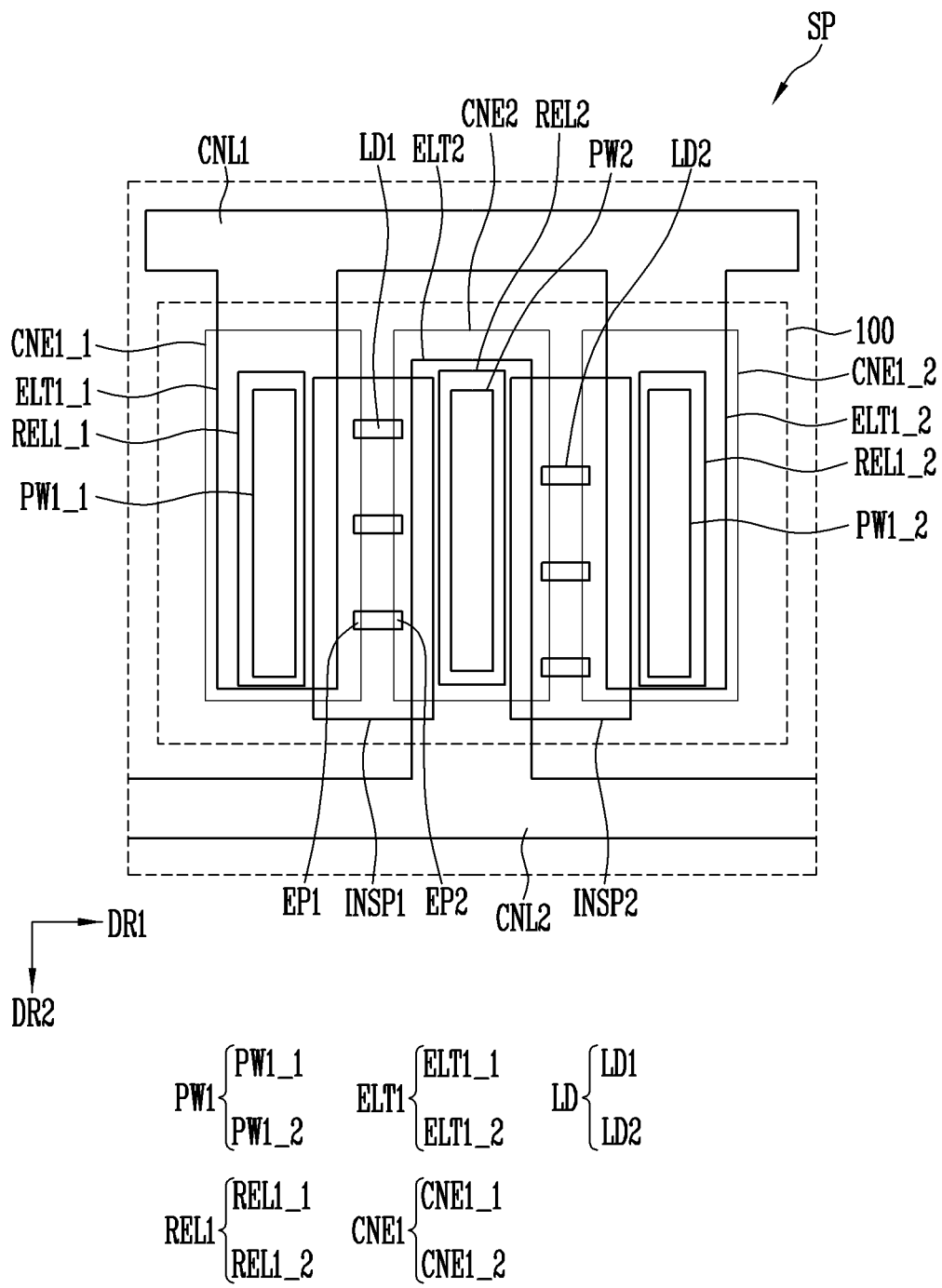
Figure 5A:
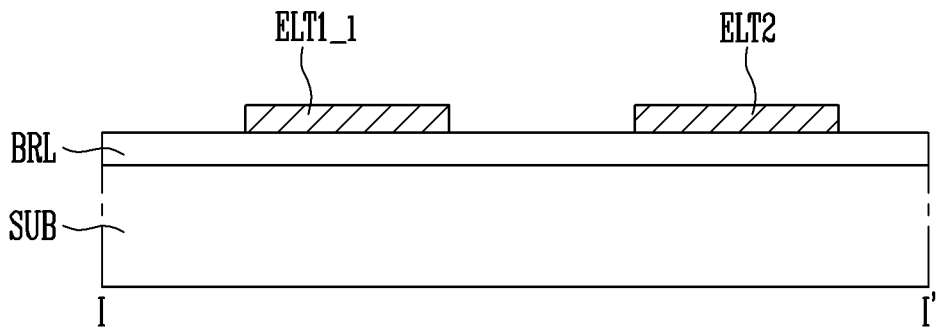
FIGS. 5A to 5K are schematic cross-sectional diagrams sequentially illustrating a method of fabricating the light emitting device of FIG. 3A.
Figure 5B:
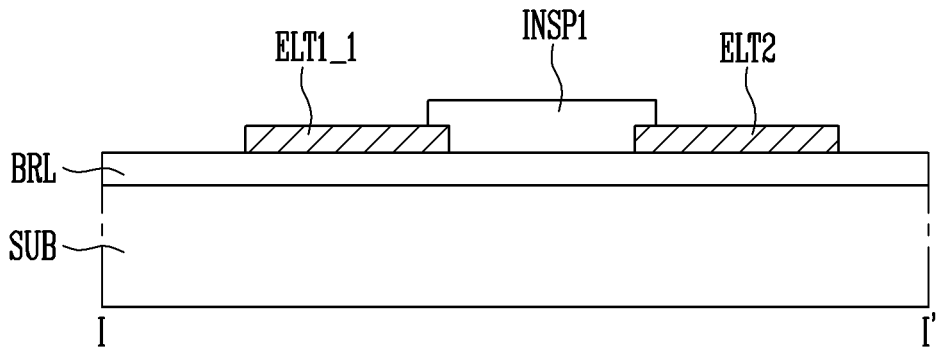
Figure 5C:
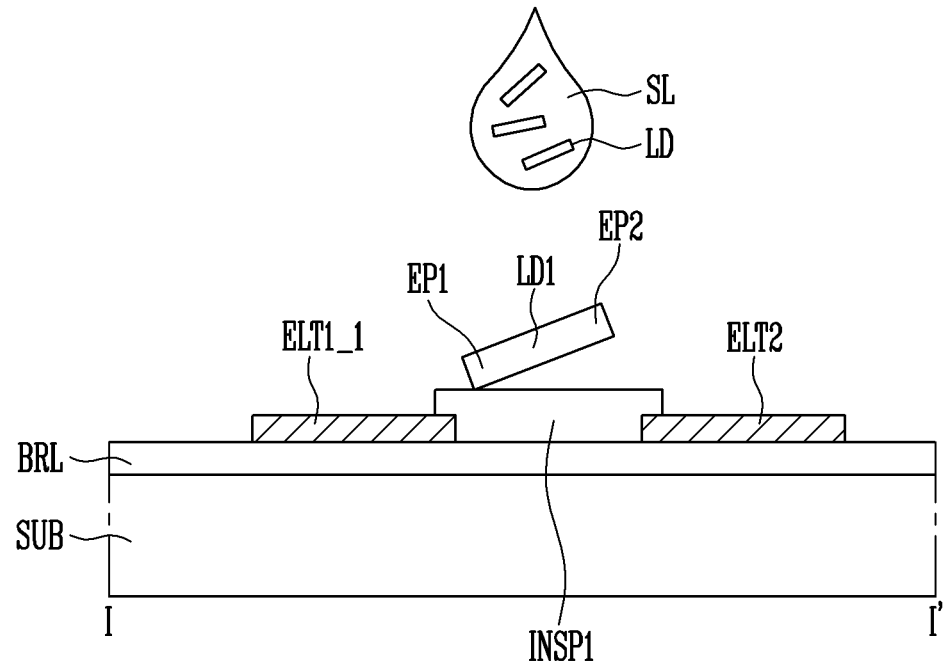
Figure 5D:
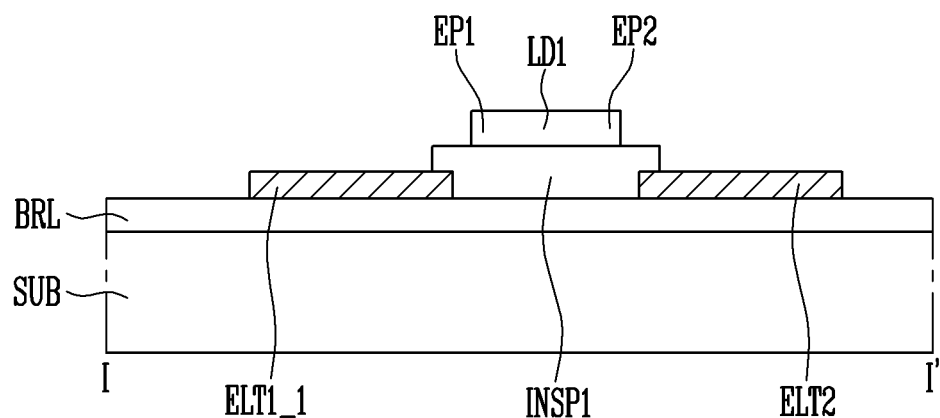
Figure 5E:
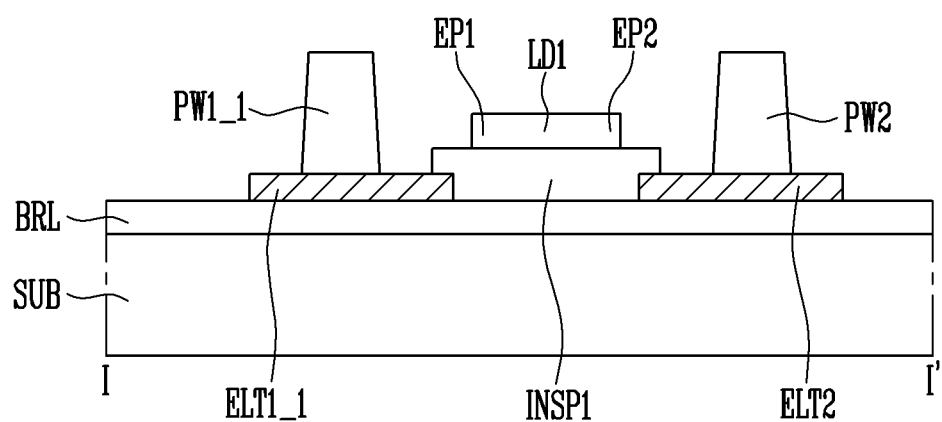
Figure 5F:
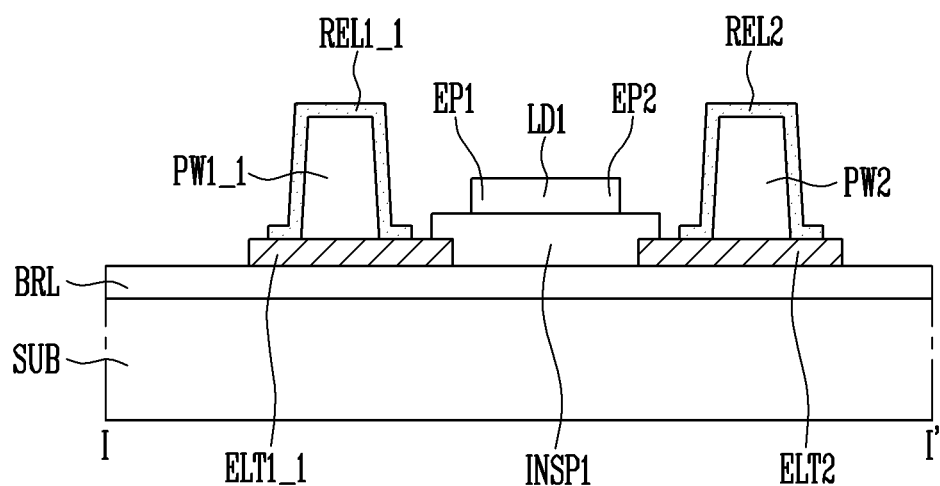
Figure 5G:
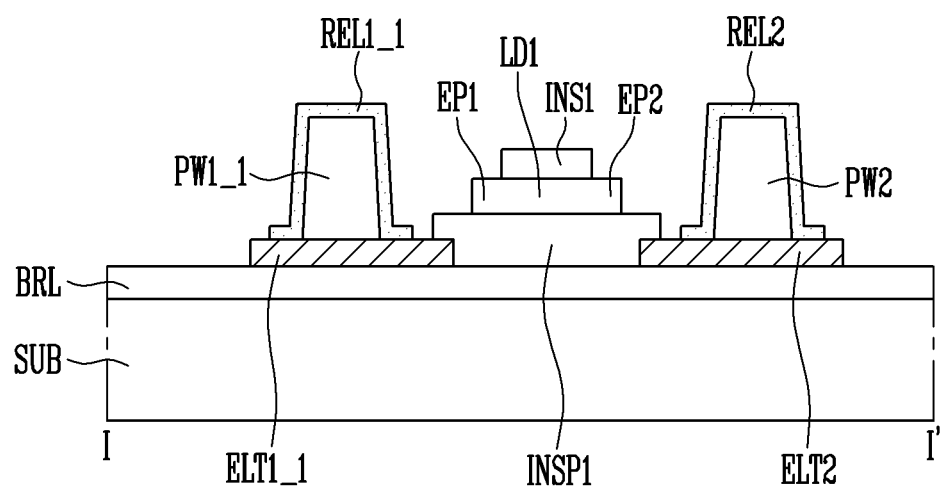
Figure 5H:
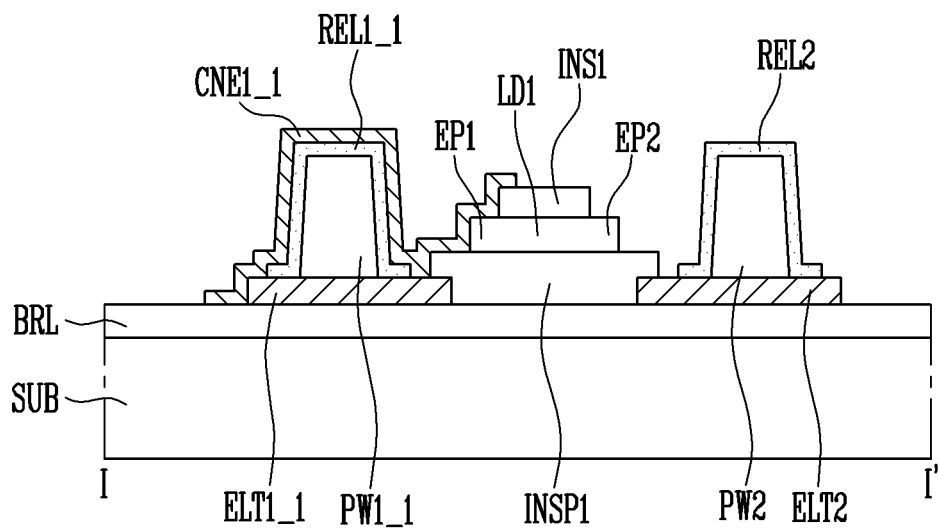
Figure 5I:
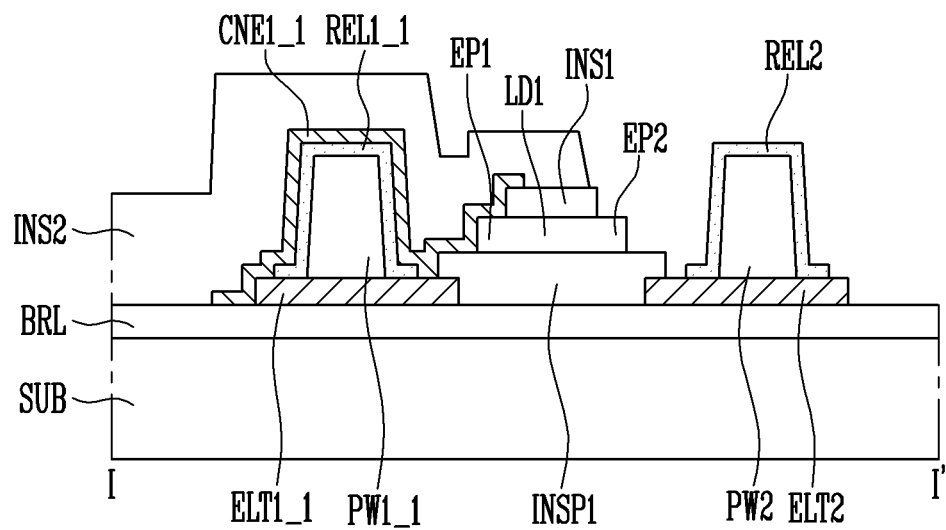
Figure 5J:
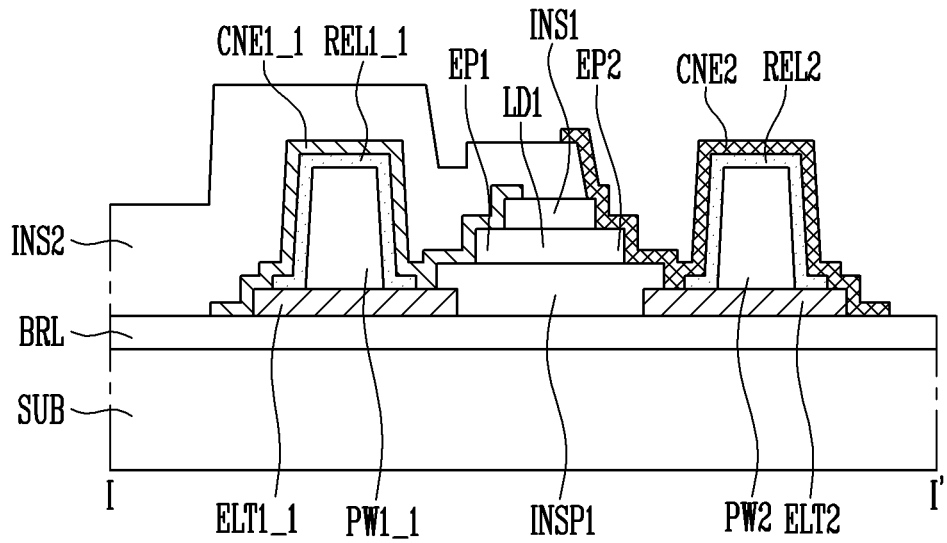
Figure 5K:
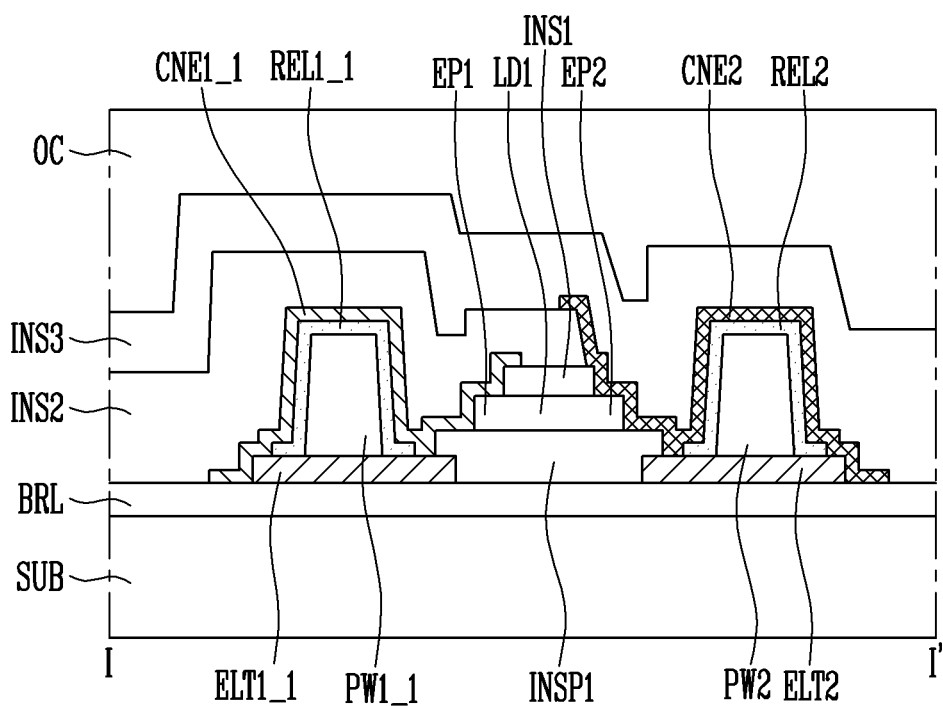

FIGS. 2A and 2B are schematic plan diagrams illustrating various types of unit emission areas of a light emitting device including the light emitting element of FIG. 1A. FIG. 3A is a schematic sectional view taken along line I-I' of FIG. 2A. FIG. 3B illustrates a light emitting device in accordance with an embodiment of the disclosure and is a schematic sectional diagram corresponding to line I-I' of FIG. 2A.

Although for the sake of convenience FIGS. 2A and 2B schematically illustrate that light emitting elements are aligned in a horizontal direction, the alignment of the light emitting elements is not limited thereto.

In FIGS. 2A and 2B, the unit emission area may be a pixel area of one of the sub-pixels included in an emission display panel.

Referring to FIGS. 1A, 2A, 2B, 3A, and 3B, the light emitting device in accordance with an embodiment of the disclosure may include a substrate SUB including at least one sub-pixel SP having a unit emission area 100, and light emitting elements LD provided on the substrate SUB.

The substrate SUB may include an insulating material such as glass, an organic polymer, or crystal. Furthermore, the substrate SUB may be made of material having flexibility so as to be bendable or foldable and may have a single-layer or multi-layer structure.

For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB may vary.

A barrier layer BRL for preventing impurities from diffusing into the light emitting elements LD may be provided on the substrate SUB.

Each of the light emitting elements LD may include a first conductive semiconductor layer 11, a second conductive semiconductor layer 13, and an active layer 12 interposed between the first and second conductive semiconductor layers 11 and 13. In some embodiments, each of the light emitting elements LD may further include an upper electrode layer 15 provided on an upper end of the second conductive semiconductor layer 13.

Each of the light emitting elements LD may include a first end EP1 and a second end EP2.

One of the first and second conductive semiconductor layers 11 and 13 may be disposed on the first end EP1, and the other of the first and second conductive semiconductor layers 11 and 13 may be disposed on the second end EP2. In an embodiment of the disclosure, each of the light emitting elements LD may emit any one light of color light and/or white light.

A first insulating layer INS1 for covering a portion of an upper surface of each of the light emitting elements LD may be provided on the light emitting element LD. Hence, the opposite ends EP1 and EP2 of each of the light emitting elements LD may be exposed to the outside.

The sub-pixel SP may include a first connection line CNL1 extending in a first direction DR1, and a second connection line CNL2 extending in a direction parallel to the direction in which the first connection line CNL1 extends.

The first connection line CNL1 may be provided to correspond to the inside of the one sub-pixel SP so that the sub-pixel SP may be electrically separated from sub-pixels adjacent thereto. Hence, the sub-pixel SP may be independently operated.

The second connection line CNL2 may extend not only to the sub-pixel SP but also the sub-pixels adjacent to the sub-pixel SP. Therefore, the sub-pixel SP and the sub-pixels adjacent thereto may be electrically connected in common to the second connection line CNL2.

The unit emission area 100 of the sub-pixel SP may further include first and second electrodes ELT1 and ELT2, first and second partition walls PW1 and PW2, first and second reflective electrodes REL1 and REL2, and first and second contact electrodes CNE1 and CNE2.

The first electrode ELT1 may be provided on the substrate SUB. The first electrode ELT1 may be disposed adjacent to the first end EP1 of each of the light emitting elements LD. The first electrode ELT1 may diverge from the first connection line CNL1 and extend in a second direction DR2 intersecting the first direction DR1.

The first electrode ELT1 may include a 1-1-th electrode ELT1_1 which diverges from the first connection line CNL1 toward one side of the second electrode ELT2, and a 1-2-th electrode ELT1_2 which diverges from the first connection line CNL1 toward the other side of the second electrode ELT2. The second electrode ELT2 may be disposed between the 1-1-th electrode ELT1_1 and the 1-2-th electrode ELT1_2.

Each of the 1-1-th electrode ELT1_1 and the 1-2-th electrode ELT1_2 may have a bar shape extending in the second direction DR2.

In an embodiment of the disclosure, the 1-1-th electrode ELT1_1 and the 1-2-th electrode ELT1_2 may be electrically connected to the first connection line CNL1. The 1-1-th electrode ELT1_1 and the 1-2-th electrode ELT1_2 may be integrally provided with the first connection line CNL1.

The second electrode ELT2 may be disposed adjacent to the second end EP2 of each of the light emitting elements LD. The first electrode ELT1 and the second electrode ELT2 may be disposed on a same layer.

The second electrode ELT2 may diverge from the second connection line CNL2 and may extend in the second direction DR2. The second electrode ELT2 may be electrically connected with the second connection line CNL2. In an embodiment of the disclosure, the second electrode ELT2 may be integrally provided with the second connection line CNL2.

In a plan view, the first electrode ELT1 and the second electrode ELT2 may be spaced apart from each other by a predetermined distance with the light emitting elements LD provided therebetween. The first electrode ELT1 and the second electrode ELT2 may be alternately disposed in the unit emission area 100 in the first direction DR1.

The first electrode ELT1 and the second electrode ELT2 may be formed of conductive material.

The first electrode ELT1 and the second electrode ELT2 may be alignment electrodes for aligning the light emitting elements LD in the unit emission area 100 of the one sub-pixel SP.

Before the light emitting elements LD are aligned in the one sub-pixel SP, a first alignment voltage may be applied to the first electrode ELT1 through the first connection line CNL1, and a second alignment voltage may be applied to the second electrode ELT2 through the second connection line CNL2. The first alignment voltage and the second alignment voltage may have different voltage levels.

As predetermined alignment voltages having different voltage levels are respectively applied to the first electrode ELT1 and the second electrode ELT2, an electric field may be formed between the first electrode ELT1 and the second electrode ELT2.

The light emitting elements LD may be aligned on the substrate SUB between the first electrode ELT1 and the second electrode ELT2 by the electric field.

In an embodiment of the disclosure, the first electrode ELT1 and the second electrode ELT2 may function as driving electrodes that respectively applies predetermined voltages to the opposite ends EP1 and EP2 of each of the light emitting elements LD in case that the light emitting elements LD are driven, but the disclosure is not limited thereto. For example, in lieu of the first electrode ELT1 and the second electrode ELT2, the first reflective electrode REL1 and the second reflective electrode REL2 may function as driving electrodes for driving the light emitting elements LD.

The first and second partition walls PW1 and PW2 may define a unit emission area 100 of the one sub-pixel SP.

The first partition wall PW1 and the second partition wall PW2 may be disposed on the substrate SUB at positions spaced apart from each other by a predetermined distance. For example, the first and second partition walls PW1 and PW2 may be disposed on the substrate SUB at positions spaced apart from each other by a distance equal to or greater than the length of one light emitting element LD.

The first and second partition walls PW1 and PW2 may be formed of insulating material including inorganic material or organic material, but the disclosure is not limited thereto.

As illustrated in FIG. 3A, each of the first and second partition walls PW1 and PW2 may have a trapezoidal cross-section, which has sides inclined at a predetermined angle and a bottom side having a width greater than that of a top side, but the disclosure is not limited thereto. In some embodiments, as illustrated in FIG. 3B, each of the first and second partition walls PW1 and PW2 may include a curved surface having a cross-sectional shape such as a semi-circle, or a semi-ellipse, the width of which reduces from one surface of the substrate SUB toward an upper end of the curved surface, but the disclosure is not limited thereto.

The shape of each of the first and second partition walls PW1 and PW2 may vary within a range in which the efficiency of light emitted from each of the light emitting elements LD can be enhanced.

In an embodiment of the disclosure, the first partition wall PW1 may be provided on the first electrode ELT1, and the second partition wall PW2 may be provided on the second electrode ELT2.

The first partition wall PW1 may include a 1-1-th partition wall PW1_1 provided on the 1-1-th electrode ELT1_1, and a 1-2-th partition wall PW1_2 provided on the 1-2-th electrode ELT1_2.

In a plan view, the 1-1-th partition wall PW1_1 and the 1-2-th partition wall PW1_2 may be spaced apart from each other with the second partition wall PW2 interposed therebetween.

The 1-1-th partition wall PW1_1, the 1-2-th partition wall PW1_2, and the second partition wall PW2 may be disposed on the same plane on the substrate SUB, and have the same height h.

The first reflective electrode REL1 and the second reflective electrode REL2 may be respectively provided on the corresponding partition walls. For example, the first reflective electrode REL1 may be provided on the first partition wall PW1, and the second reflective electrode REL2 may be provided on the second partition wall PW2.

The first and second reflective electrodes REL1 and REL2 may respectively have shapes corresponding to those of the first and second partition walls PW1 and PW2. Therefore, the first reflective electrode REL1 may have a shape corresponding to an inclination of the first partition wall PW1, and the second reflective electrode REL2 may have a shape corresponding to an inclination of the second partition wall PW2.

The first and second reflective electrodes REL1 and REL2 may be provided on the substrate SUB at positions spaced apart from each other with the light emitting elements LD interposed therebetween.

In an embodiment of the disclosure, the first reflective electrode REL1 may be disposed adjacent to one of the opposite ends EP1 and EP2 of each of the light emitting elements LD and may be electrically connected to each of the light emitting elements LD through the first contact electrode CNE1. The second reflective electrode REL2 may be disposed adjacent to the other one of the opposite ends EP1 and EP2 of each of the light emitting elements LD and may be electrically connected to each of the light emitting elements LD through the second contact electrode CNE2.

The first reflective electrode REL1 and the second reflective electrode REL2 may be disposed on the same plane and have the same height. If the first reflective electrode REL1 and the second reflective electrode REL2 have the same height, each of the light emitting elements LD may be more reliably electrically connected to the first and second reflective electrodes REL1 and REL2.

The first and second reflective electrodes REL1 and REL2 may be formed of conductive material. The conductive material may include metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT.

Each of the first and second reflective electrodes REL1 and REL2 may have a single layer structure, but the disclosure is not limited thereto. For example, it may have a multilayer structure formed by stacking two or more materials of metals, alloys, conductive oxides, and conductive polymers.

The material of the first and second reflective electrodes REL1 and REL2 is not limited to the above-mentioned materials. For example, the first and second reflective electrodes REL1 and REL2 may be made of conductive material having a predetermined reflectivity to allow light emitted from the opposite ends of the light emitting elements LD to travel in a direction (e.g., in a frontal direction) in which an image is displayed.

Particularly, since the first and second reflective electrodes REL1 and REL2 have shapes corresponding to the shapes of the first and second partition walls PW1 and PW2, light emitted from the opposite ends EP1 and EP2 of each of the light emitting elements LD may be reflected by the first and second reflective electrodes REL1 and REL2, whereby the light may more effectively travel in the frontal direction.

Consequently, the efficiency of light emitted from the light emitting elements LD may be enhanced.

In an embodiment of the disclosure, the first and second partition walls PW1 and PW2, along with the first and second reflective electrodes REL1 and REL2 provided on the first and second partition walls PW1 and PW2, may function as reflective components for enhancing the efficiency of light emitted from each of the light emitting elements LD.

In an embodiment of the disclosure, the first reflective electrode REL1 may include a 1-1-th reflective electrode REL1_1 and a 1-2-th reflective electrode REL1_2. The second reflective electrode REL2 may be disposed between the 1-1-th reflective electrode REL1_1 and the 1-2-th reflective electrode REL1_2.

The 1-1-th reflective electrode REL1_1 may be provided on the 1-1-th partition wall PW1_1. The 1-2-th reflective electrode REL1_2 may be provided on the 1-2-th partition wall PW1_2.

The 1-1-th reflective electrode REL1_1, the 1-2-th reflective electrode REL1_2, and the second reflective electrode REL2 each may have a bar shape extending in the second direction DR2.

The 1-1-th reflective electrode REL1_1 may be electrically connected with the 1-1-th electrode ELT1_1. The 1-2-th reflective electrode REL1_2 may be electrically connected with the 1-2-th electrode ELT1_2. The second reflective electrode REL2 may be electrically connected with the second electrode ELT2.

Although for the sake of explanation the first and second reflective electrodes REL1 and REL2 are illustrated as being directly provided on the substrate SUB, the disclosure is not limited thereto. For example, a component for enabling the display device to be driven as a passive matrix or an active matrix may be further provided between the substrate SUB and the first and second reflective electrodes REL1 and REL2.

In the case where the light emitting device is driven as the active matrix, for example, signal lines, an insulating layer, and/or a transistor may be provided between the substrate SUB and the first and second reflective electrodes REL1 and REL2.

The signal lines may include a scan line, a data line, a power line, etc. The transistor may be electrically connected to the signal lines and may include a gate electrode, a semiconductor layer, a source electrode, and a drain electrode.

Any one of the first and second reflective electrodes REL1 and REL2 may be an anode electrode, and the other reflective electrode may be a cathode electrode. In an embodiment of the disclosure, the first reflective electrode REL1 may be an anode electrode, and the second reflective electrode REL2 may be cathode electrode.

In this case, one electrode of the source and drain electrodes of the transistor may be electrically connected to any one electrode of the first and second reflective electrodes REL1 and REL2. A data signal of the data line may be applied to the any one electrode through the transistor. Here, the numbers and shapes of signal lines, insulating layer, and/or transistors may vary.

In an embodiment of the disclosure, the first reflective electrode REL1 may be electrically connected to the transistor through a contact hole (not illustrated). Hence, a signal provided to the transistor may be applied to the first reflective electrode REL1.

In the case where the light emitting device is driven as an active matrix, the second reflective electrode REL2 may be electrically connected to the signal line through the contact hole (not illustrated). Hence, a voltage of the signal line may be applied to the second reflective electrode REL2.

In an embodiment, in lieu of the first reflective electrode REL1, the first electrode ELT1 may be used as the anode electrode. In lieu of the second reflective electrode REL2, the second electrode ELT2 may be used as the cathode electrode.

In this case, one electrode of the source and drain electrodes of the transistor may be electrically connected to the first electrode ELT1. A data signal of the data line supplied through the transistor may be applied to the first reflective electrode REL1 through the first electrode ELT1. The signal line may be electrically connected to the second electrode ELT2. A signal provided to the signal line may be applied to the second reflective electrode REL2 through the second electrode ELT2.

In a plan view, the first reflective electrode REL1 may overlap the first electrode ELT1, and the second reflective electrode REL2 may overlap the second electrode ELT2.

In an embodiment of the disclosure, the light emitting elements LD may be divided into first light emitting elements LD1 aligned between the 1-1-th reflective electrode REL1_1 and the second reflective electrode REL2, and second light emitting elements LD2 aligned between the second reflective electrode REL2 and the 1-2-th reflective electrode REL1_2.

The first contact electrode CNE1 may be provided on the first reflective electrode REL1 to electrically and/or physically reliably connect the first reflective electrode REL1 with any one of the opposite ends EP1 and EP2 of each of the light emitting elements LD.

The first contact electrode CNE1 may be formed of transparent conductive material to allow light emitted from each of the light emitting elements LD and reflected by the first reflective electrode REL1 to travel in the frontal direction without loss. For example, the transparent conductive material may include ITO, IZO, ITZO, etc. The material of the first contact electrode CNE1 is not limited to the above-mentioned materials.

In a plan view, the first contact electrode CNE1 may cover the first reflective electrode REL1 and may overlap the first reflective electrode REL1. The first contact electrode CNE1 may partially overlap one of the opposite ends EP1 and EP2 of each of the light emitting elements LD.

In an embodiment of the disclosure, the first contact electrode CNE1 may include a 1-1-th contact electrode CNE1_1 provided on the 1-1-th reflective electrode REL1_1, and a 1-2-th contact electrode CNE1_2 provided on the 1-2-th reflective electrode REL1_2.

In a plan view, the 1-1-th contact electrode CNE1_1 may overlap the first end EP1 of each of the first light emitting elements LD1 and the 1-1-th reflective electrode REL1_1. In a plan view, the 1-2-th contact electrode CNE1_2 may overlap the second end EP2 of each of the second light emitting elements LD2 and the 1-2-th reflective electrode REL1_2.

A second insulating layer INS2 for covering the first contact electrode CNE1 may be provided on the first contact electrode CNE1. The second insulating layer INS2 may prevent the first contact electrode CNE1 from being exposed to the outside, thus preventing the first contact electrode CNE1 from corroding.

The second reflective electrode REL2 may be provided on the second contact electrode CNE2. In a plan view, the second contact electrode CNE2 may cover the second reflective electrode REL2 and overlap the second reflective electrode REL2. The second contact electrode CNE2 may overlap the second end EP2 of each of the first light emitting elements LD1 and the first end EP1 of each of the second light emitting elements LD2.

The second contact electrode CNE2 and the first contact electrode CNE1 may be made of the same material, but the disclosure is not limited thereto.

A third insulating layer INS3 for covering or overlapping the second contact electrode CNE2 may be provided on the second contact electrode CNE2. The third insulating layer INS3 may prevent the second contact electrode CNE2 from being exposed to the outside, thus preventing the second contact electrode CNE2 from corroding.

An overcoat layer OC may be provided on the third insulating layer INS3.

The overcoat layer OC may be a planarization layer for mitigating step or height differences between top surfaces formed by the first and second partition walls PW1 and PW2, the first and second reflective electrodes REL1 and REL2, the first and second contact electrodes CNE1 and CNE2, etc., that are disposed under the overcoat layer OC. The overcoat layer OC may function as an encapsulation layer for preventing oxygen or water from penetrating into the light emitting elements LD.

In some embodiments, the overcoat layer OC may be omitted. In the case where the overcoat layer OC is omitted, the second insulating layer INS2 may function as an encapsulation layer for preventing oxygen or water from penetrating into the light emitting elements LD.

As described above, the first end EP1 of each of the first light emitting elements LD1 may be electrically connected to the 1-1-th reflective electrode REL1_1, and the second end EP2 of each of the first light emitting elements LD1 may be electrically connected to a first side of the second reflective electrode REL2. Hence, predetermined voltages may be respectively applied to the opposite ends EP1 and EP2 of each of the first light emitting elements LD1 through the 1-1-th reflective electrode REL1_1 and the second reflective electrode REL2. Thus, each of the first light emitting elements LD1 may emit light by coupling of electron-hole pairs in the active layer 12 of each of the first light emitting elements LD1.

The first end EP1 of each of the second light emitting elements LD2 may be electrically connected to a second side of the second reflective electrode REL2. The second end EP2 of each of the second light emitting elements LD2 may be electrically connected to the 1-2-th reflective electrode REL1_2. Hence, predetermined voltages may be respectively applied to the opposite ends EP1 and EP2 of each of the second light emitting elements LD2 through the second reflective electrode REL2 and the 1-2-th reflective electrode REL1_2. Thus, each of the second light emitting elements LD2 may emit light by coupling of electron-hole pairs in the active layer 12 of each of the second light emitting elements LD2.

The unit emission area 100 of the one sub-pixel SP may further include a first insulating pattern INSP1 and a second insulating pattern INSP2.

Each of the first insulating pattern INSP1 and the second insulating pattern INSP2 may include any one of an inorganic insulating layer formed of inorganic material, or an organic insulating layer formed of organic material.

In a plan view, the first insulating pattern INSP1 may be disposed between the 1-1-th electrode ELT1_1 and the second electrode ELT2. In a plan view, the first insulating pattern INSP1 may be disposed between the 1-1-th reflective electrode REL1_1 and the second reflective electrode REL2.

The first insulating pattern INSP1 may have a bar shape extending in the second direction DR2 and may overlap each of the first light emitting elements LD1.

In a plan view, the second insulating pattern INSP2 may be disposed between the second electrode ELT2 and the 1-2-th electrode ELT1_2. In a plan view, the second insulating pattern INSP2 may be disposed between the second reflective electrode REL2 and the 1-2-th reflective electrode REL1_2. The second insulating pattern INSP2 may have a bar shape extending in the second direction DR2 and overlap each of the second light emitting elements LD2.

In an embodiment of the disclosure, the first light emitting elements LD1 may be provided on the first insulating pattern INSP1, and the second light emitting elements LD2 may be provided on the second insulating pattern INSP2.

In a plan view, a width W1 of the first insulating pattern INSP1 with respect to a lateral direction (e.g., the first direction DR1) may be greater than a length L of the first light emitting elements LD1. The width W1 of the first insulating pattern INSP1 with respect to the lateral direction may be greater than a distance W2 between the 1-1-th electrode ELT1_1 and the second electrode ELT2. The width W1 of the first insulating pattern INSP1 with respect to the lateral direction may be less than a distance W3 between the 1-1-th reflective electrode REL1_1 and the second reflective electrode REL2.

A thickness d of the first insulating pattern INSP1 may range from about 0 nm to about 300 nm. The second insulating pattern INSP2 and the first insulating pattern INSP1 may have the same structure.

In an embodiment, the unit emission area 100 of the one sub-pixel SP may further include a bridge pattern BRP extending in the first direction DR1, as illustrated in FIG. 2B.

The bridge pattern BRP may be integrally provided with the first connection line CNL1 and electrically and physically connected to the first connection line CNL1. In this case, the first alignment voltage may be transmitted to the first connection line CNL1 through the bridge pattern BRP. The first alignment voltage transmitted to the first connection line CNL1 may be supplied to the 1-1-th electrode ELT1_1 and the 1-2-th electrode ELT1_2 that diverge from the first connection line CNL1.

Hereinafter, the configuration of the light-emitting device according to an embodiment of the disclosure will be described in accordance with a stacking sequence with reference to FIGS. 2A and 3A.

The 1-1-th electrode ELT1_1, the second electrode ELT2, and the 1-2-th electrode ELT1_2 may be provided on the substrate SUB on which the barrier layer BRL is provided.

The 1-1-th electrode ELT1_1, the second electrode ELT2, and the 1-2-th electrode ELT1_2 may be disposed on the barrier layer BRL at positions spaced apart from each other by a predetermined distance.

The first insulating pattern INSP1 may be provided between the 1-1-th electrode ELT1_1 and the second electrode ELT2. The second insulating pattern INSP2 may be provided between the second electrode ELT2 and the 1-2-th electrode ELT1_2.

The first insulating pattern INSP1 may overlap a first side of the 1-1-th electrode ELT1_1 and a first side of the second electrode ELT2. The second insulating pattern INSP2 may overlap a second side of the second electrode ELT2 and a first side of the 1-2-th electrode ELT1_2.

The first insulating pattern INSP1 may fill in a space between the substrate SUB and the first light emitting elements LD1, may stably support the first light emitting elements LD1, and prevent the first light emitting elements LD1 from being displaced from original positions thereof. Likewise, the second insulating pattern INSP2 may fill in space between the substrate SUB and the second light emitting elements LD2, may stably support the second light emitting elements LD2, and may prevent the second light emitting elements LD2 from being displaced from original positions thereof.

The first light emitting elements LD1 may be aligned on the first insulating pattern INSP1. The second light emitting elements LD2 may be aligned on the second insulating pattern INSP2. In detail, the first light emitting elements LD1 may be aligned on a portion of an upper surface of the first insulating pattern INSP1. The second light emitting elements LD2 may be aligned on a portion of an upper surface of the second insulating pattern INSP2.

The length L of each of the first light emitting elements LD1 may be less than the width W1 of the first insulating pattern INSP1 with respect to the lateral direction. The length L of each of the second light emitting elements LD2 may be less than the width of the second insulating pattern INSP2 with respect to the lateral direction.

The 1-1-th reflective electrode REL1_1 may be provided on the 1-1-th partition wall PW1_1. The second reflective electrode REL2 may be provided on the second partition wall PW2. The 1-2-th reflective electrode REL1_2 may be provided on the 1-2-th partition wall PW1_2.

In an embodiment of the disclosure, the height h of each of the 1-1-th partition wall PW1_1, the 1-2-th partition wall PW1_2, and the second partition wall PW2 may be greater than the length L of each of the first and second light emitting elements LD1 and LD2.

The 1-1-th partition wall PW1_1 may be provided on the 1-1-th electrode ELT1_1. The second partition wall PW2 may be provided on the second electrode ELT2. The 1-2-th partition wall PW1_2 may be provided on the 1-2-th electrode ELT1_2.

The 1-1-th reflective electrode REL1_1, the second reflective electrode REL2, and the 1-2-th reflective electrode REL1_2 may be provided on the same plane (or layer), and each of them may have a shape corresponding to the shape of the corresponding partition wall.

The first insulating layer INS1 may be provided on each of the first and second light emitting elements LD1 and LD2. The first insulating layer INS1 may include an inorganic insulating layer including inorganic material or an organic insulating layer including organic material.

The 1-1-th contact electrode CNE1_1 may be provided on the 1-1-th reflective electrode REL1_1. The 1-2-th contact electrode CNE1_2 may be provided on the 1-2-th reflective electrode REL1_2.

In an embodiment, a first capping layer (not illustrated) may be provided between the 1-1-th reflective electrode REL1_1 and the 1-1-th contact electrode CNE1_1 and between the 1-2-th reflective electrode REL1_2 and the 1-2-th contact electrode CNE1_2.

The first capping layer may prevent the 1-1-th reflective electrode REL1_1 and the 1-2-th reflective electrode REL1_2 from being damaged by defects or the like caused during a process of fabricating the light emitting device. The first capping layer may further increase adhesive force between the substrate SUB and each of the 1-1-th and 1-2-th reflective electrodes REL1_1 and REL1_2.

The second insulating layer INS2 may be provided on the substrate SUB on which the 1-1-th contact electrode CNE1_1 and the 1-2-th contact electrode CNE1_2 are provided. The second insulating layer INS2 may be provided on the substrate SUB to cover the 1-1-th contact electrode CNE1_1, the 1-2-th contact electrode CNE1_2, and the first insulating layer INS1.

The second contact electrode CNE2 that is electrically connected with the second reflective electrode REL2 may be provided on the substrate SUB on which the second insulating layer INS2 is provided.

In an embodiment, a second capping layer (not illustrated) may be provided between the second reflective electrode REL2 and the second contact electrode CNE2.

The second capping layer may prevent the second reflective electrode REL2 from being damaged by defects or the like caused during a process of fabricating the light emitting device, and may further increase adhesive force between the second reflective electrode REL2 and the substrate SUB.

The third insulating layer INS3 may be provided on the substrate SUB on which the second contact electrode CNE2 is provided. The third insulating layer INS3 may include either an inorganic insulating layer including inorganic material or an organic insulating layer including organic material.

The overcoat layer OC may be provided on the third insulating layer INS3.

As described above, the 1-1-th partition wall PW1_1, the second partition wall PW2, and the 1-2-th partition wall PW1_2 may be provided on the substrate SUB after the first and second light emitting elements LD1 and LD2 are aligned on the corresponding insulating patterns.

In this case, the first and second light emitting elements LD1 and LD2 may be aligned in a target area in the unit emission area 100 of the one sub-pixel SP without being affected by the 1-1-th partition wall PW1_1, the second partition wall PW2, or the 1-2-th partition wall PW1_2. Hence, the probability of alignment defects in which the first and second light emitting elements LD1 and LD2 are aligned in undesired areas may be reduced.

The design of each of the 1-1-th partition wall PW1_1, the second partition wall PW2, and the 1-2-th partition wall PW1_2 can be independent from alignment conditions of the first and second light emitting elements LD1 and LD2 or other conditions. In other words, restrictions in designing each of the 1-1-th partition wall PW1_1, the second partition wall PW2, and the 1-2-th partition wall PW1_2 may be mitigated. Therefore, the shape(s) of each of the 1-1-th partition wall PW1_1, the second partition wall PW2, and the 1-2-th partition wall PW1_2 may vary within a range in which the efficiency of light emitted from each of the first and second light emitting elements LD1 and LD2 can be enhanced.

In an embodiment of the disclosure, the height h of each of the 1-1-th partition wall PW1_1, the second partition wall PW2, and the 1-2-th partition wall PW1_2 may be designed to be equal to or greater than a predetermined level. For example, each of the 1-1-th partition wall PW1_1, the second partition wall PW2, and the 1-2-th partition wall PW1_2 may be designed to have a height h equal to or greater than the length L of each of the first and second light emitting elements LD1 and LD2 so as to enhance the light emitting efficiency of each of the first and second light emitting elements LD1 and LD2.

If the 1-1-th partition wall PW1_1 is designed to have a height h, which is equal to or greater than a predetermined level, the 1-1-th reflective electrode REL1_1 may include a protrusion which protrudes from the substrate SUB in the frontal direction by the height h of the 1-1-th partition wall PW1_1. In this case, light emitted from the first end EP1 of each of the first light emitting elements LD1 may be reflected more intensively in the frontal direction by the protrusion of the 1-1-th reflective electrode REL1_1. Therefore, the light emitting efficiency of the light emitted from the first end EP1 of each of the first light emitting elements LD1 may be enhanced.

Likewise, if the second partition wall PW2 is designed to have a height h, which is equal to or greater than a predetermined level, the second reflective electrode REL2 may include a protrusion which protrudes from the substrate SUB in the frontal direction by the height h of the second partition wall PW2. In this case, light emitted from the second end EP2 of each of the first light emitting elements LD1 and the first end EP1 of each of the second light emitting elements LD2 may be reflected more intensively in the frontal direction by the protrusion of the second reflective electrode REL2. Therefore, the efficiency of the light emitted from the second end EP2 of each of the first light emitting elements LD1 and the first end EP1 of each of the second light emitting elements LD2 may be enhanced.

If the 1-2-th partition wall PW1_2 is designed to have a height h, which is equal to or greater than a predetermined level, the 1-2-th reflective electrode REL1_2 may include a protrusion which protrudes from the substrate SUB in the frontal direction by the height h of the 1-2-th partition wall PW1_2. In this case, light emitted from the second end EP2 of each of the second light emitting elements LD2 may be reflected more intensively in the frontal direction by the protrusion of the 1-2-th reflective electrode REL1_2. Therefore, the light emitting efficiency of the light emitted from the first end EP1 of each of the second light emitting elements LD2 may be enhanced.

In an embodiment of the disclosure, the first insulating pattern INSP1 and the second insulating pattern INSP2 may be provided on only some areas of the substrate SUB in the unit emission area 100.

The first insulating pattern INSP1 may be provided between the 1-1-th electrode ELT1_1 and the second electrode ELT2 and between the substrate SUB and the first light emitting elements LD1. The second insulating pattern INSP2 may be provided between the second electrode ELT2 and the 1-2-th electrode ELT1_2 and between the substrate SUB and the second light emitting elements LD2.

Here, some of light emitted from each of the first and second light emitting elements LD1 and LD2 may be drawn into the first and second insulating pattern INSP1 and INSP2.

If the first and second insulating pattern INSP1 and INSP2 are provided on the overall area of the substrate SUB, some of light emitted from each of the first and second light emitting elements LD1 and LD2 may be guided toward undesired areas through the first and second insulating patterns INSP1 and INSP2, causing optical losses. Hence, the light emitting efficiency of the first and second light emitting elements LD1 and LD2 may be reduced.

In an embodiment of the disclosure, the first and second insulating patterns INSP1 and INSP2 are disposed only between the first electrode ELT1 and the second electrode ELT2, blocking paths along which light emitted from each of the first and second light emitting elements LD1 and LD2 may be guided toward undesired areas.

As a result, in accordance with embodiments of the disclosure, light emitted from each of the first and second light emitting elements LD1 and LD2 may be reflected in the frontal direction without (or with less) loss. Hence, the light emitting efficiency of the first and second light emitting elements LD1 and LD2 may be enhanced.

FIGS. 4A to 4G are schematic plan diagrams sequentially illustrating a method of fabricating the light emitting device of FIG. 2A. FIGS. 5A to 5K are sectional diagrams sequentially illustrating a method of fabricating the light emitting device of FIG. 3A.

Referring to FIGS. 1A, 2A, 3A, 4A, and 5A, a first connection line CNL1 extending in a first direction DR1 and a second connection line CNL2 extending in a direction parallel to the first connection line CNL1 may be formed on the substrate SUB of the unit emission area 100 of the sub-pixel SP.

A first electrode ELT1 extending from the first connection line CNL1 in a second direction DR2 intersecting the first direction DR1 and a second electrode ELT2 extending from the second connection line CNL2 in the second direction DR2 are formed on the substrate SUB.

The first connection line CNL1 and the first electrode ELT1 may be integrally provided. The second connection line CNL2 and the second electrode ELT2 may be integrally provided. The first electrode ELT1 and the second electrode ELT2 may be disposed on the same plane and may be spaced apart from each other by a predetermined distance.

The first electrode ELT1 may include a 1-1-th electrode ELT1_1 and a 1-2-th electrode ELT1_2 which diverge from the first connection line CNL1 with the second electrode ELT2 interposed therebetween.

Referring to FIGS. 1A, 2A, 3A, 4B, 5A, and 5B, after a first insulating material layer (not illustrated) is formed on the substrate SUB, a first insulating pattern INSP1 and a second insulating pattern INSP2 are formed by removing portions of the first insulating material layer.

The first insulating material layer may include an inorganic insulating layer including inorganic material or an organic insulating layer including organic material.

The first insulating pattern INSP1 may be formed only on the substrate SUB between the 1-1-th electrode ELT_1_1 and the second electrode ELT2. The first insulating pattern INSP1 may have a bar shape extending in the second direction DR2 in a plan view. The first insulating pattern INSP1 may overlap a first side of the 1-1-th electrode ELT1_1 and a first side of the second electrode ELT2.

The second insulating pattern INSP2 may be formed only on the substrate SUB between the second electrode ELT2 and the 1-2-th electrode ELT1_2. The second insulating pattern INSP2 and the first insulating pattern INSP1 may have the same shape, but the disclosure is not limited thereto. The second insulating pattern INSP2 may overlap a second side of the second electrode ELT2 and a first side of the 1-2-th electrode ELT1_2.

Referring to FIGS. 1A, 2A, 3A, 4C, and 5A to 5D, an electric field is formed between the first electrode ELT1 and the second electrode ELT2 by applying alignment voltages to the first and second electrodes ELT1 and ELT2 through the first and second connection lines CNL1 and CNL2, respectively.

In the case where alternating current power or direct current power having a predetermined voltage and a period is repeatedly applied several times to each of the first and second electrodes ELT1 and ELT2 through the first and second connection lines CNL1 and CNL2, an electric field may be formed between the first and second electrodes ELT1 and ELT2 by a difference in potential between the first and second electrodes ELT1 and ELT2.

While the electric field is formed between the first electrode ELT1 and the second electrode ELT2, light emitting elements LD are supplied onto the substrate SUB by an inkjet printing method or the like.

For example, the light emitting elements LD may be supplied onto the substrate SUB of the unit emission area 100 by disposing a nozzle over the substrate SUB and dropping a solution SL, in which the light emitting elements LD are dispersed, onto the substrate SUB through the nozzle. The solution SL may be any one of acetone, water, alcohol, and toluene, but the disclosure is not limited thereto. For example, the solution SL may include material which may be vaporized at the room temperature or by heat. The solution SL may have the form of ink or paste.

The method of supplying the light emitting elements LD onto the substrate SUB is not limited to the foregoing method. The method of supplying the light emitting elements LD may vary. Subsequently, the solution SL may be removed.

If the light emitting elements LD are supplied onto the substrate SUB, self-alignment of the light emitting elements LD may be induced by the electric field formed between the first electrode ELT1 and the second electrode ELT2. Hence, the light emitting elements LD may be aligned between the first electrode ELT1 and the second electrode ELT2.

In an embodiment of the disclosure, the light emitting elements LD may be aligned on each of the first insulating pattern INSP1 and the second insulating pattern INSP2.

Since the electric field is formed between the 1-1-th electrode ELT1_1 and the second electrode ELT2, some of the light emitting elements LD, e.g., first light emitting elements LD1, may be aligned on the first insulating pattern INSP1 between the 1-1-th electrode ELT1_1 and the second electrode ELT2.

Since the electric field is formed between the second electrode ELT2 and the 1-2-th electrode ELT1_2, the other light emitting elements LD, e.g., second light emitting elements LD2, may be aligned on the second insulating pattern INSP2 between the second electrode ELT2 and the 1-2-th electrode ELT1_2.

After the alignment of the light emitting elements LD is completed, the first connection line CNL1 is divided into parts between sub-pixels adjacent to each other with respect to the first direction DR1 so that each of the sub-pixels SP can be independently driven.

In case that the first electrode ELT1 of each of the sub-pixels SP is electrically connected to a pixel driving circuit including a transistor, etc., in a corresponding sub-pixel SP, the first connection line CNL1 that is electrically connected in common to the adjacent sub-pixels in the first direction DR1 is cut into parts by the respective sub-pixels SP. In this case, the first electrode ELT1 electrically connected to the first connection line CNL1 may be divided into parts by the respective sub-pixels SP.

The respective second electrodes ELT2 of the sub-pixels disposed adjacent to each other in the first direction DR1 of the substrate SUB may be electrically connected in common to the second connection line CNL2. Therefore, the respective second electrodes ELT2 of the sub-pixels disposed adjacent to each other in the first direction DR1 may be electrically connected to each other without being separated from each other. However, the disclosure is not limited to the foregoing structure. For example, in an embodiment, the second connection line CNL2 that is electrically connected in common between the sub-pixels disposed adjacent to each other in the first direction DR1 may be cut into parts corresponding to the respective sub-pixels SP. In this case, the second electrodes ELT2 electrically connected to the second connection line CNL2 may be separated from each other by the respective sub-pixels SP.

Referring to FIGS. 1A, 2A, 3A, 4D, and 5A to 5E, after a second insulating material layer (not illustrated) is formed on the substrate SUB on which the light emitting elements LD are aligned, a first partition wall PW1 and a second partition wall PW2 are formed by patterning the second insulating material layer using a mask.

The second insulating material layer may include an inorganic insulating layer including inorganic material or an organic insulating layer including organic material. In an embodiment of the disclosure, the second insulating material layer may include the organic insulating layer.

The first partition wall PW1 may be formed on the first electrode ELT1, and the second partition wall PW2 may be formed on the second electrode ELT2.

In a plan view, a width of the first partition wall PW1 with respect to a lateral direction (e.g., the first direction DR1) may be less than a width of the first electrode ELT1 with respect to the lateral direction. However, the disclosure is not limited the foregoing structure. For example, the width of the first partition wall PW1 with respect to the lateral direction may be equal to the width of the first electrode ELT1 with respect to the lateral direction.

For example, in a plan view, the width of the second partition wall PW2 with respect to the lateral direction may be less than the width of the second electrode ELT2 with respect to the lateral direction. However, the disclosure is not limited to the foregoing structure. For example, the width of the second partition wall PW2 with respect to the lateral direction may be equal to the width of the second electrode ELT2 with respect to the lateral direction.

The height h of each of the first partition wall PW1 and the second partition wall PW2 may be greater than the length L of each of the light emitting elements LD. Each of the first partition wall PW1 and the second partition wall PW2 may have various shapes within a range in which the efficiency of light emitted from each of the light emitting elements LD can be enhanced.

Referring to FIGS. 1A, 2A, 3A, 4E, and 5A to 5F, after a first conductive layer (not illustrated) is formed on the substrate SUB including the first and second partition walls PW1 and PW2, a first reflective electrode REL1 and a second reflective electrode REL2 are formed by patterning the first conductive layer using a mask.

The first reflective electrode REL1 may be formed on the first partition wall PW1 and electrically connected with the first electrode ELT1. The second reflective electrode REL2 may be formed on the second partition wall PW2 and electrically connected with the second electrode ELT2.

The first reflective electrode REL1 may be disposed adjacent to any one of the opposite ends EP1 and EP2 of each of the light emitting elements LD. The second reflective electrode REL2 may be disposed adjacent to the other one of the opposite ends EP1 and EP2 of each of the light emitting elements LD.

The first reflective electrode REL1 and the second reflective electrode REL2 may be disposed on the same plane and spaced apart from each other by a predetermined distance.

The first reflective electrode REL1 may correspond to the shape of the first partition wall PW1. The second reflective electrode REL2 may correspond to the shape of the second partition wall PW2.

For example, the first reflective electrode REL1 may include a protrusion which protrudes from the upper surface of the substrate SUB by the height h of the first partition wall PW1. The second reflective electrode REL2 may include a protrusion which protrudes from the upper surface of the substrate SUB by the height h of the second partition wall PW2.

In the case where each of the first reflective electrode REL1 and the second reflective electrode REL2 includes a protrusion that protrudes by or more than a predetermined level depending on the shape of the corresponding partition wall, light emitted from the opposite ends EP1 and EP2 of each of the light emitting elements LD may be reflected more intensively in the frontal direction by the first and second reflective electrodes REL1 and REL2. In an embodiment of the disclosure, the frontal direction may refer to a direction in which an image is displayed on the light emitting device in accordance with an embodiment of the disclosure.

Referring to FIGS. 1A, 2A, 3A, and 5A to 5G, after a third insulating material layer (not illustrated) is formed on the first reflective electrode REL1 and the second reflective electrode REL2, a first insulating layer INS1 is formed by patterning the third insulating material layer using a mask.

The first insulating layer INS1 may be disposed on a portion of the upper surface of each of the light emitting elements LD such that the opposite ends EP1 and EP2 of each of the light emitting elements LD may be exposed.

In an embodiment, the third insulating material layer may be patterned through a mask process of forming a second insulating layer INS2 as described below, forming the first insulating layer INS1.

Referring to FIGS. 1A, 2A, 3A, 4F, and 5A to 5H, after a second conductive layer (not illustrated) is formed on the first insulating layer INS1, a first contact electrode CNE1 is formed by patterning the second conductive layer using a mask.

The first contact electrode CNE1 may be formed on the first reflective electrode REL1 and electrically connected with the first reflective electrode REL1. The first contact electrode CNE1 may be formed on one end of the opposite ends EP1 and EP2 of each of the light emitting elements LD and electrically connected with the one end of each of the light emitting elements LD.

Therefore, the first reflective electrode REL1 and the one end of each of the light emitting elements LD may be electrically connected with each other through the first contact electrode CNE1.

Referring to FIGS. 1A, 2A, 3A, and 5A to 5I, after a fourth insulating material layer (not illustrated) is formed on the first contact electrode CNE1, the second insulating layer INS2 is formed by patterning the fourth insulating material layer using a mask.

The fourth insulating material layer may include an inorganic insulating layer including inorganic material or an organic insulating layer including organic material.

Here, the first contact electrode CNE1 may not be exposed to the outside by the second insulating layer INS2. The second reflective electrode REL2 and the other end of the opposite ends EP1 and EP2 of each of the light emitting elements LD may be exposed to the outside.

Referring to FIGS. 1A, 2A, 3A, 4G, and 5A to 5J, after a third conductive layer (not illustrated) is formed on the substrate SUB including the second insulating layer INS2, a second contact electrode CNE2 is formed by patterning the third conductive layer using a mask.

The second contact electrode CNE2 may be formed on the exposed second reflective electrode REL2 and electrically connected with the second reflective electrode REL2. The second contact electrode CNE2 may be formed on the other exposed end of each of the light emitting elements LD and electrically connected with the other end of each of the light emitting elements LD.

Therefore, the second reflective electrode REL2 and the other end of each of the light emitting elements LD may be electrically connected with each other through the second contact electrode CNE2.

Referring to FIGS. 1A, 2A, 3A, and 5A to 5K, a third insulating layer INS3 is formed on the overall surface of the substrate SUB including the second contact electrode CNE2.

The third insulating layer INS3 may be formed of an inorganic insulating layer including inorganic material, or an organic insulating layer including organic material. Although the third insulating layer INS3 may have a single layer structure as shown in the drawing, the disclosure is not limited thereto. For example, the third insulating layer INS3 may have a multi-layer structure.

Subsequently, the overcoat layer OC is formed on the third insulating layer INS3.

Figure 6:
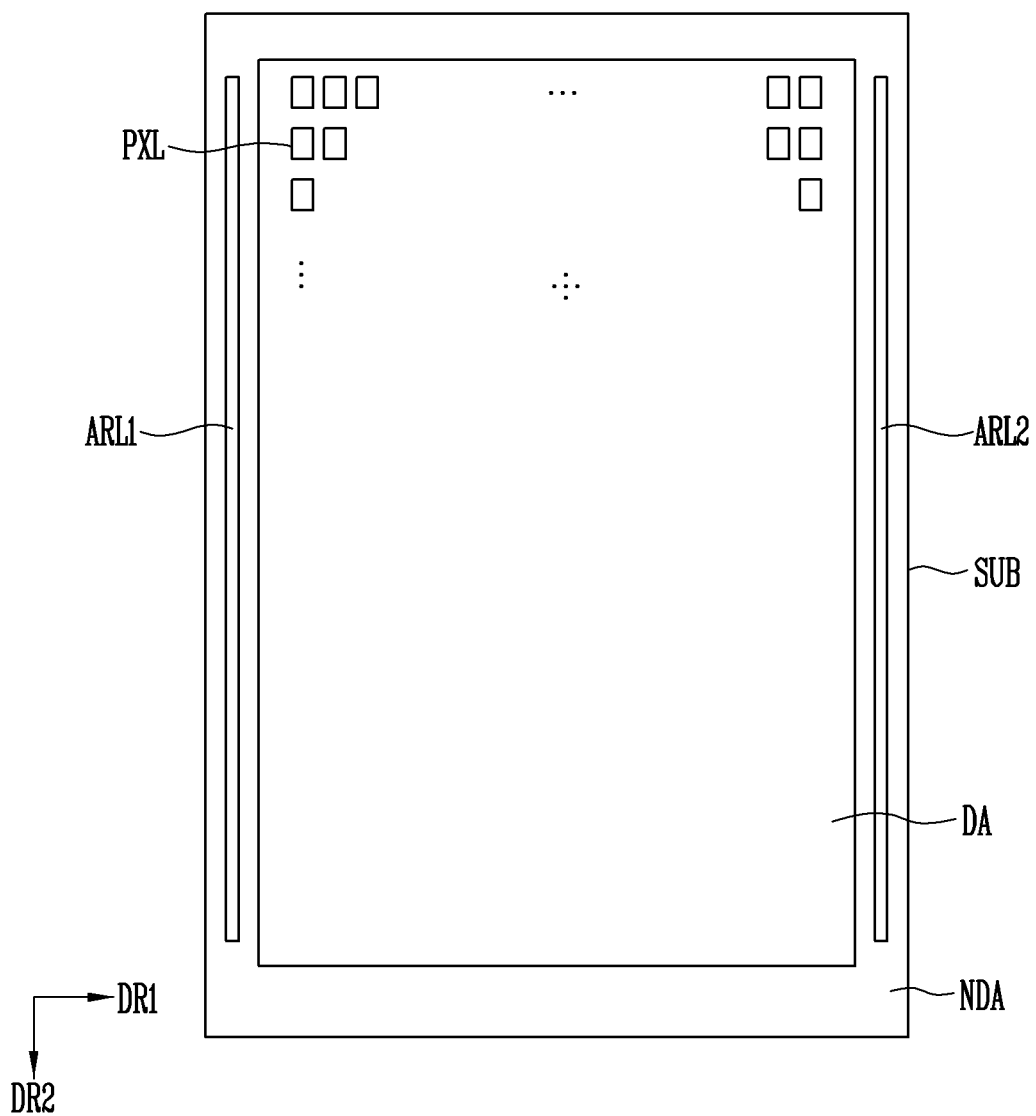
FIG. 6 illustrates a display device in accordance with an embodiment of the disclosure, and particularly, is a schematic plan diagram illustrating a display device using the light emitting element illustrated in FIG. 1A as a light emitting source.

FIG. 6 illustrates a display device in accordance with an embodiment of the disclosure and is a schematic plan diagram illustrating a display device using the light emitting element illustrated in FIG. 1A as a light emitting source.

For the sake of explanation, FIG. 6 schematically illustrates the structure of the display device, focused on a display area on which an image is displayed. In some embodiments, although not illustrated, at least one driving circuit (e.g., a scan driver and a data driver) and/or lines may be further provided in the display device.

Referring to FIGS. 1A and 6, the display device in accordance with an embodiment of the disclosure may include a substrate SUB, pixels PXL provided on the substrate SUB and each including at least one light emitting element LD, a driver (not illustrated) provided on the substrate SUB and driving the pixels PXL, and a line component (not illustrated) provided to electrically connect the pixels PXL with the driver.

The display device may be classified into a passive-matrix type display device or an active-matrix type display device according to a method of driving the light emitting element LD. For example, in the case where the display device is implemented as an active-matrix type, each of the pixels PXL may include a driving transistor that controls the amount of current to be supplied to the light emitting element LD, and a switching transistor that transmits data signals to the driving transistor.

Recently, active-matrix type display devices capable of selectively turning on each pixel PXL taking into account the resolution, the contrast, and the working speed have been mainstreamed. However, the disclosure is not limited thereto. For example, passive-matrix type display devices in which a group of pixels PXL may be turned on may also employ components (e.g., first and second reflective electrodes) for driving the light emitting element LD.

The substrate SUB may include a display area DA and a non-display area NDA.

In an embodiment, the display area DA may be disposed in a central portion of the display device, and the non-display area NDA may be disposed in a perimeter portion of the display device in such a way as to enclose the display area DA. The locations of the display area DA and the non-display area NDA are not limited to this, and the locations thereof may vary.

The display area DA may be an area in which the pixels PXL for displaying an image are provided. The non-display area NDA may be an area in which the driver for driving the pixels PXL and some of the line component for electrically connecting the pixels PXL to the driver are provided.

The display area DA may have various shapes. For example, the display area DA may be provided in various shapes such as a closed polygon including sides formed of linear lines, a circle, an ellipse or the like including a side formed of a curved line, and a semicircle, a semi-ellipse or the like including sides formed of a linear line and a curved line.

The non-display area NDA may be provided on at least one side of the display area DA. In an embodiment of the disclosure, the non-display area NDA may enclose the periphery of the display area DA.

The pixels PXL may be provided in the display area DA on the substrate SUB. Each of the pixels PXL refers to a smallest unit for displaying the image, and multiple pixels may be provided.

Each of the pixels PXL may include the light emitting element LD that is driven in response to a corresponding scan signal and a corresponding data signal. The light emitting element LD may have a small size corresponding, e.g., to a nano-scale or a micro-scale size and be electrically connected in parallel to light emitting elements disposed adjacent thereto. The light emitting element LD may form a light source of the corresponding pixel PXL.

The pixels PXL may be arranged in a matrix form along rows extending in a first direction DR1 and columns extending in a second direction DR2 intersecting the first direction DR1. However, the arrangement of the pixels PXL is not limited to a particular arrangement. In other words, the pixels PXL may be arranged in various forms.

The driver may provide a signal to each pixel PXL through the line component and thus control the operation of the pixel PXL. In FIG. 6, for the sake of explanation, the line component is omitted.

The driver may include a scan driver that provides a scan signal to the pixels PXL through a scan line, an emission driver that provides an emission control signal to the pixels PXL through an emission control line, a data driver that provides a data signal to the pixels PXL through a data line, and a timing controller. The timing controller may control the scan driver, the emission driver, and the data driver.

A first alignment line ARL1 and a second alignment line ARL2 may be provided in the non-display area NDA.

The first alignment line ARL1 and the second alignment line ARL2 may extend in the second direction DR2, and may be electrically connected to first and second electrodes (refer to ELT1 and ELT2 of FIG. 2A) included in each pixel PXL before the light emitting element LD is aligned in the display area DA. A first alignment voltage may be applied to the first alignment line ARL1. A second alignment voltage having a voltage level different from that of the first alignment voltage may be applied to the second alignment line ARL2.

The first alignment line ARL1 and the second alignment line ARL2 may be electrically separated from each pixel PXL during a process following the process of aligning the light emitting elements LD in the display area DA.

As described above, although the first alignment line ARL1 and the second alignment line ARL2 may remain in the non-display area NDA during the process of fabricating the display device, the disclosure is not limited thereto. In an embodiment, the first alignment line ARL1 and the second alignment line ARL2 may be removed during a process following the process of aligning the light emitting elements LD in the display area DA, and thus may not remain in the non-display area NDA.

Figure 7A:
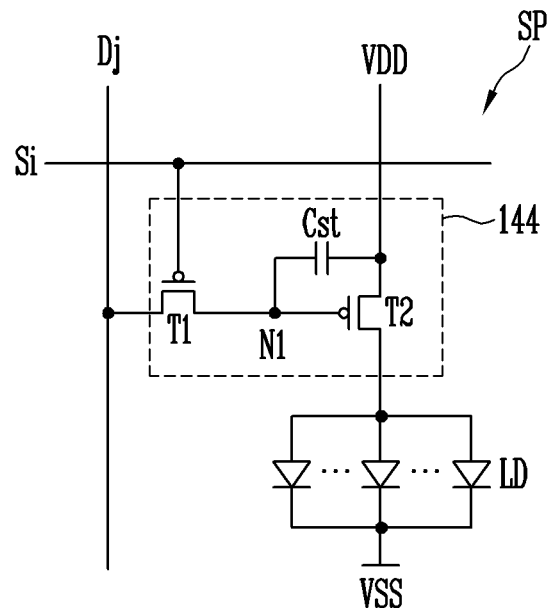
FIGS. 7A to 7D are schematic circuit diagrams illustrating examples of a unit light emitting area of the display device of FIG. 6 in accordance with various embodiments.
Figure 7B:
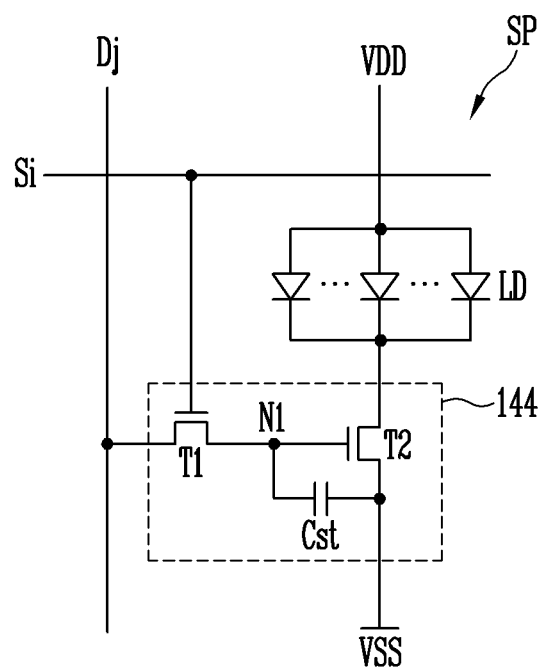
Figure 7C:
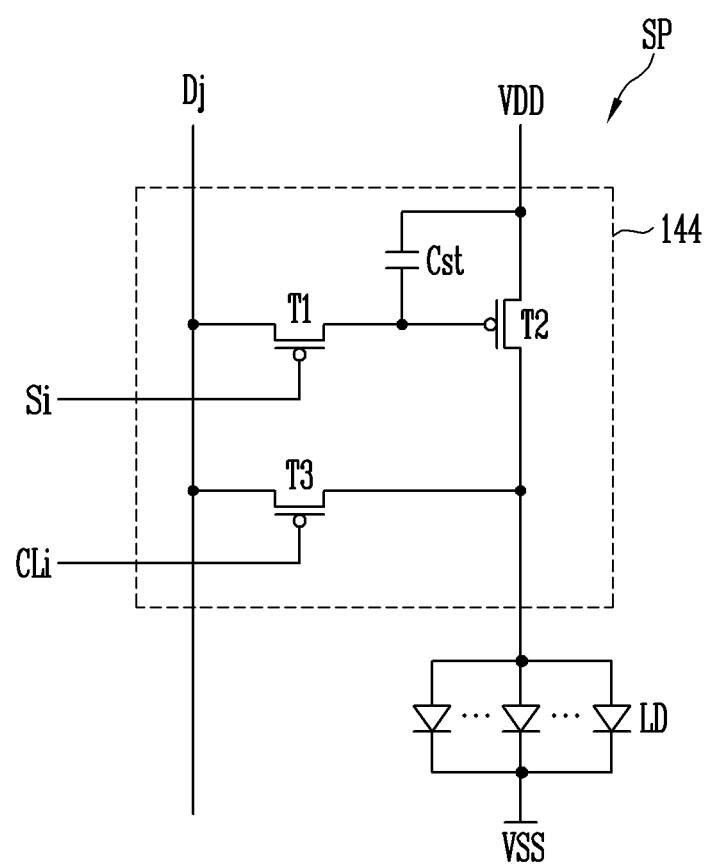

FIGS. 7A to 7C are circuit diagrams schematically illustrating examples of a unit light emitting area of the display device of FIG. 6 in accordance with various embodiments.

Referring to FIGS. 7A to 7C, the unit light emitting area may be a pixel area in which one sub-pixel included in one pixel is provided. Referring to FIGS. 7A to 7C, the one sub-pixel may be formed of an active pixel. Here, the type, the structure, and/or the driving scheme of the one sub-pixel is not particularly limited. For example, the one sub-pixel may be formed of a pixel of a passive or active display device which can have various structures known in the art.

Referring to FIGS. 6, and 7A, the one sub-pixel SP may include a plurality of light emitting elements LD electrically connected in parallel to each other between a first driving power supply VDD and a second driving power supply VSS (or referred to as second driving power VSS), and a pixel driving circuit 144 that drives the light emitting elements LD.

Each of the light emitting elements LD may include a first electrode (e.g., an anode electrode) electrically connected to the first driving power supply VDD via the pixel driving circuit 144, and a second electrode (e.g., a cathode electrode) electrically connected to the second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting elements LD.

Each of the light emitting elements LD may emit light at a luminance corresponding to a driving current that is controlled by the pixel driving circuit 144.

Although FIGS. 7A to 7C illustrate embodiments in which the light emitting elements LD are electrically connected in parallel to each other in the same direction (e.g., a forward direction) between the first and second driving power supplies VDD and VSS, the disclosure is not limited thereto. For example, in an embodiment, some of the light emitting elements LD may be electrically connected in forward direction between the first and second driving power supplies VDD and VSS, and the other light emitting elements LD may be electrically connected in a reverse direction. One of the first and second driving power supplies VDD and VSS may provide an alternating voltage. In this case, groups of the light emitting elements LD connected in an identical direction may alternately emit light. As another example, in an embodiment, the one sub-pixel SP may include a single light emitting element LD.

In an embodiment of the disclosure, the pixel driving circuit 144 may include first and second transistors T1 and T2, and a storage capacitor Cst. However, the structure of the pixel driving circuit 144 is not limited to the embodiment illustrated in FIG. 7A.

The first transistor T1 (switching transistor) includes a first electrode electrically connected to a data line Dj, and a second electrode electrically connected to a first node N1. Here, the first electrode and the second electrode of the first transistor T1 may be different electrodes. For example, if the first electrode is a source electrode, the second electrode is a drain electrode. The first transistor T1 may include a gate electrode electrically connected to the scan line Si.

In case that a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The storage capacitor Cst is charged by the data signal transmitted to the first node N1.

The second transistor T2 (driving transistor) may include a first electrode electrically connected to the first driving power supply VDD, and a second electrode electrically connected to the first electrode of each of the light emitting elements LD. The second transistor T2 may include a gate electrode electrically connected to the first node N1. The second transistor T2 may control the amount of driving current to be supplied to the light emitting elements LD in response to the voltage of the first node N1.

One electrode of the storage capacitor Cst is electrically connected to the first driving power supply VDD, and the other electrode thereof is electrically connected to the first node N1. The storage capacitor Cst may charge a voltage corresponding to the data signal supplied to the first node N1 and maintain the charged voltage until a data signal of a subsequent frame is supplied.

For the sake of explanation, FIG. 7A illustrates the pixel driving circuit 144 having a relatively simple structure including the first transistor T1 configured to transmit the data signal to the sub-pixel SP, the storage capacitor Cst that stores the data signal, and the second transistor T2 that supplies driving current corresponding to the data signal to the light emitting element LD.

However, the disclosure is not limited to the foregoing structure, and the structure of the pixel driving circuit 144 may vary. For example, the pixel driving circuit 144 may further include at least one transistor element such as a transistor element that compensates for the threshold voltage of the second transistor T2, a transistor element that initializes the first node N1, and/or a transistor element that controls an emission time of the light emitting element LD, or other circuit elements such as a boosting capacitor for boosting the voltage of the first node N1.

Furthermore, although the transistors, e.g., the first and second transistors T1 and T2, included in the pixel driving circuit 144 have been illustrated as being formed of P-type transistors in FIG. 7A, the disclosure is not limited to this. In other words, at least one of the first and second transistors T1 and T2 included in the pixel driving circuit 144 may be formed of an N-type transistor.

Referring to FIGS. 6 and 7B, the first and second transistors T1 and T2 in accordance with an embodiment of the disclosure may be N-type transistors. The configuration and operation of the pixel driving circuit 144 illustrated in FIG. 7B, other than a change in connection positions of some components due to a change in the type of transistor, are similar to those of the pixel driving circuit 144 of FIG. 7A. Therefore, detailed descriptions pertaining to this will be omitted.

In an embodiment, as illustrated in FIG. 7C, the pixel driving circuit 144 may further include a third transistor T3 as well as the first and second transistors T1 and T2.

The third transistor T3 may include a gate electrode electrically connected to a control line CLi, and a second electrode electrically connected to the first electrode of each of the light emitting elements LD. The first electrode of the third transistor T3 is connected to the data line Dj. The third transistor T3 may be turned on in case that a control signal is supplied to the control line CLi and may be turned off in the other cases.

For the sake of convenience, although FIG. 7C illustrates that the third transistor T3 is a P-type transistor as an example, the third transistor T3 may be an N-type transistor. For example, at least one of the first to third transistors T1 to T3 included in the pixel driving circuit 144 may be an N-type transistor. All of the first to third transistors T1 to T3 included in the pixel driving circuit 144 may be formed of N-type transistors.

Figure 7D:
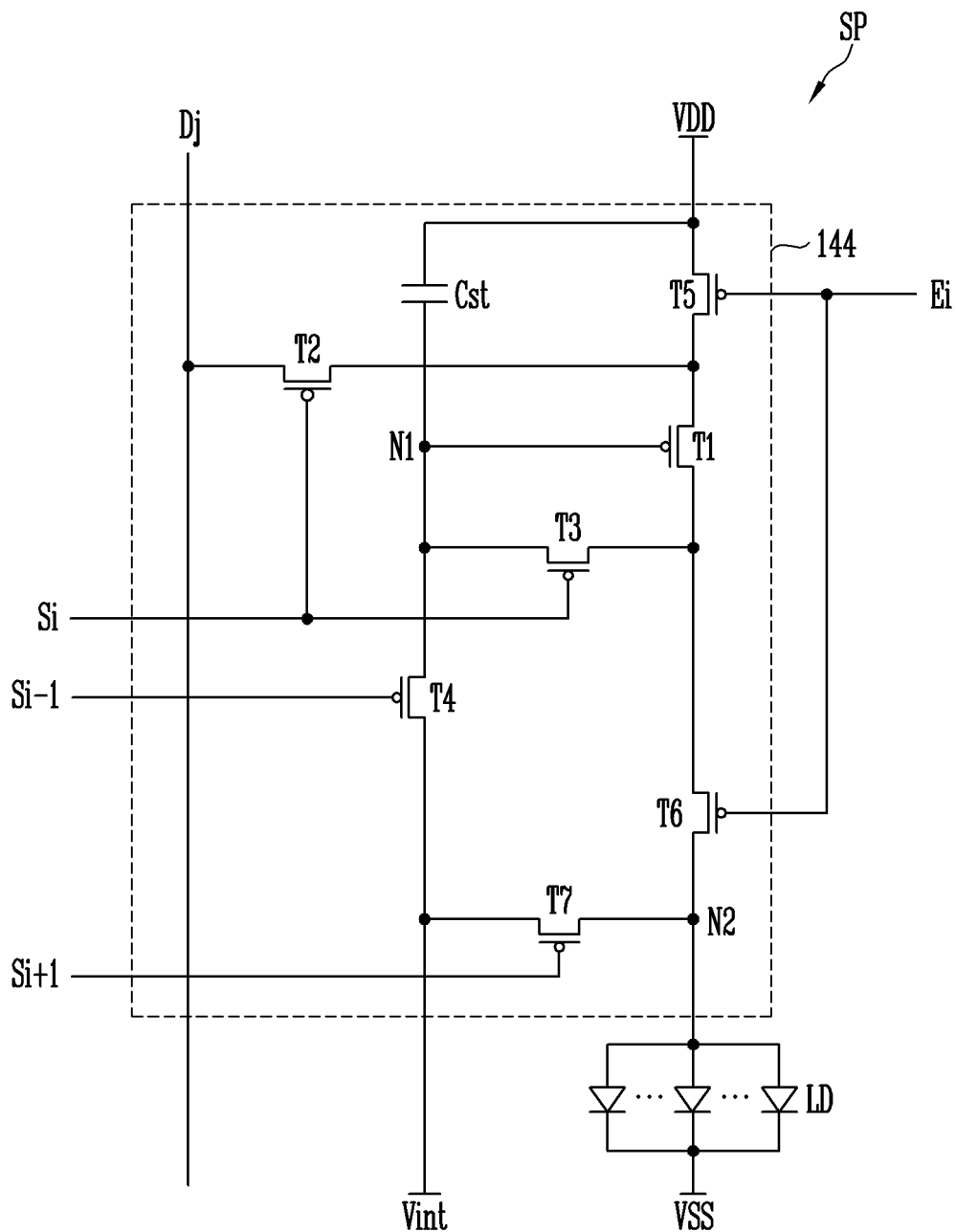

FIG. 7D is a schematic circuit diagram illustrating another example of the unit light emitting area of the display device of FIG. 6.

Referring to FIGS. 6, and 7D, the one sub-pixel SP may include light emitting elements LD electrically connected in parallel to each other between a first driving power supply VDD and a second driving power supply VSS, and a pixel driving circuit 144 that drives the light emitting elements LD.

Each of the light emitting elements LD may include an anode electrode electrically connected to the first driving power supply VDD via the pixel driving circuit 144, and a cathode electrode electrically connected to the second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting elements LD.

Each of the light emitting elements LD may emit light at a luminance corresponding to driving current that is controlled by the pixel driving circuit 144.

The pixel driving circuit 144 may be electrically connected to a scan line and a data line of the one sub-pixel SP. For example, if the one sub-pixel SP is disposed on an i-th row and a j-th column of the display area DA, the pixel driving circuit 144 of the one sub-pixel SP may be electrically connected to an i-th scan line Si and a j-th data line Dj of the display area DA.

In an embodiment, the pixel driving circuit 144 may be further electrically connected to at least one scan line. For example, the one sub-pixel SP disposed on the i-th row of the display area DA may be further electrically connected to an i−1-th scan line Si−1 and/or an i+1-th scan line Si+1.

In an embodiment, the pixel driving circuit 144 may be electrically connected not only to the first and second driving power supplies VDD and VSS but also to a third power supply. For example, the pixel driving circuit 144 may also be electrically connected to an initialization power supply Vint.

The pixel driving circuit 144 may include first to seventh transistors T1 to T7, and a storage capacitor Cst.

The first transistor (driving transistor) T1 may include a first electrode, e.g., a source electrode, electrically connected to the first driving power supply VDD via the fifth transistor T5, and a second electrode, e.g., a drain electrode, electrically connected to one ends of light emitting elements LD via the sixth transistor T6. The first transistor T1 may include a gate electrode electrically connected to a first node N1. The first transistor T1 may control driving current flowing between the first driving power supply VDD and the second driving power supply VSS via the light emitting elements LD in response to the voltage of the first node N1.

The second transistor (switching transistor) T2 may be electrically connected between the j-th data line Dj electrically connected to the one sub-pixel SP and the source electrode of the first transistor T1. A gate electrode of the second transistor T2 is electrically connected to the i-th scan line Si electrically connected to the one sub-pixel SP. In case that a scan signal having a gate-on voltage (e.g., a low-level voltage) is supplied from the i-th scan line Si, the second transistor T2 is turned on to electrically connect the j-th data line Dj to the source electrode of the first transistor T1. Hence, if the second transistor T2 is turned on, a data signal supplied from the j-th data line Dj may be transmitted to the first transistor T1.

The third transistor T3 is connected between the drain electrode of the first transistor T1 and the first node N1. The third transistor T3 may include a gate electrode electrically connected to the i-th scan line Si. In case that a scan signal having a gate-on voltage is supplied from the scan line Si, the third transistor T3 may be turned on to electrically connect the drain electrode of the first transistor T1 to the first node N1. Therefore, in case that the third transistor T3 is turned on, the first transistor T1 may be diode-connected.

The fourth transistor T4 is connected between the first node N1 and the initialization power supply Vint. A gate electrode of the fourth transistor T4 is electrically connected to a preceding scan line, e.g., an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 is connected between the first driving power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage is supplied to the i-th emission control line Ei and may be turned on in other cases.

The sixth transistor T6 is connected between the first transistor T1 and a second node N2, which is electrically connected to one end of each of the light emitting elements LD. A gate electrode of the sixth transistor T6 is electrically connected to the i-th emission control line Ei. The sixth transistor T6 may be turned off in case that an emission control signal having a gate-off voltage is supplied to the i-th emission control line Ei and may be turned on in other cases.

The seventh transistor T7 is connected between the second node N2, which is electrically connected to the one end of each of the light emitting elements LD, and the initialization power supply Vint. A gate electrode of the seventh transistor T7 is electrically connected to any one of scan lines of a subsequent stage, e.g., to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the one end of each of the light emitting elements LD.

The storage capacitor Cst may be connected between the first driving power supply VDD and the first node N1. The storage capacitor Cst may store a voltage corresponding and to the threshold voltage of the first transistor T1 and/or the data signal applied to the first node N1 during each frame period.

For the sake of convenience, FIG. 7D illustrates that all of the first to seventh transistors T1 to T7 are formed of P-type transistors, but the disclosure is not limited thereto. In other words, at least one of the first to seventh transistors T1 and T7 included in the pixel driving circuit 144 may be an N-type transistor.

Figure 8:
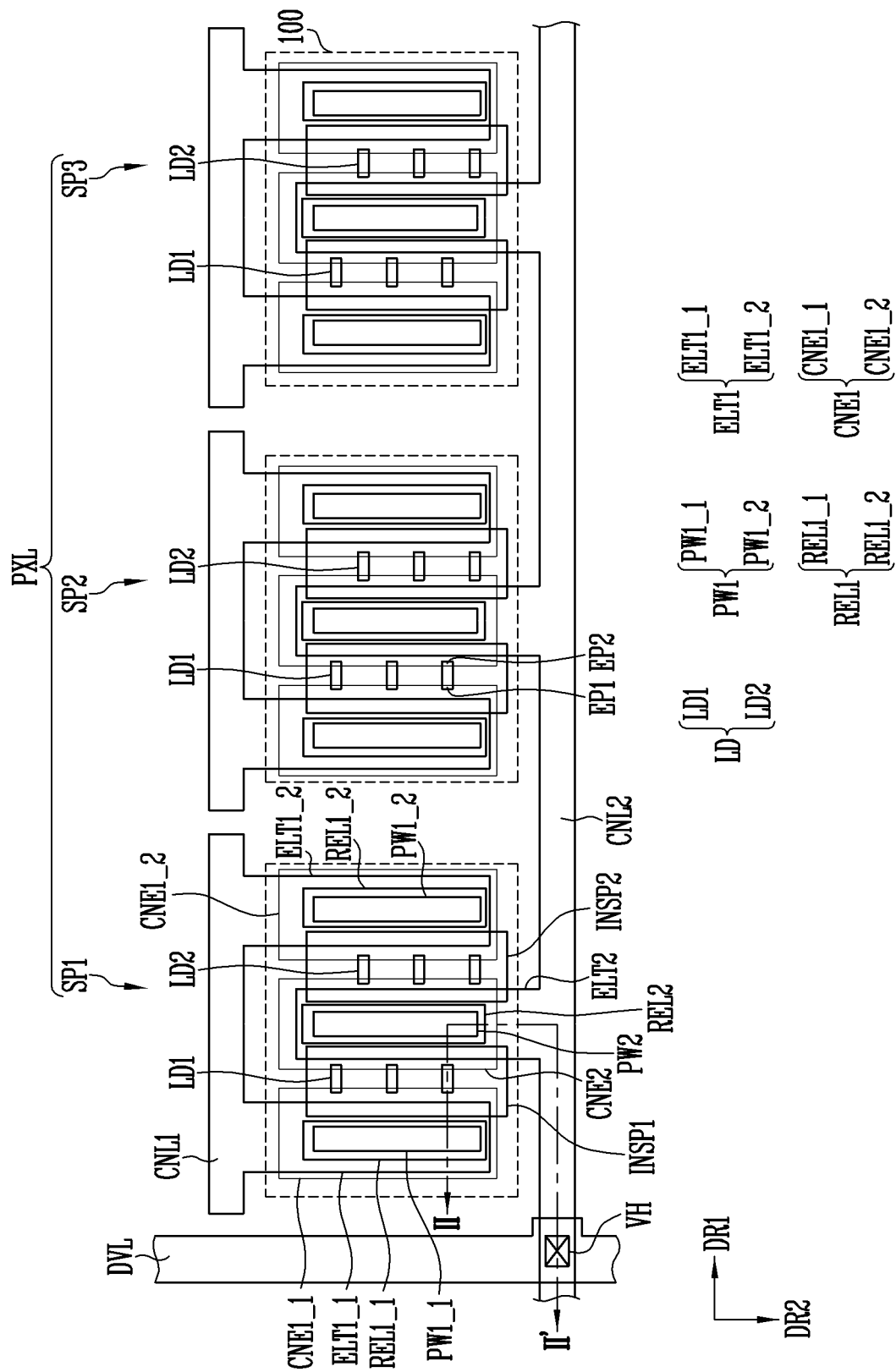
FIG. 8 is a schematic plan diagram schematically illustrating first to third sub-pixels included in one of pixels illustrated in FIG. 6.
Figure 9A:
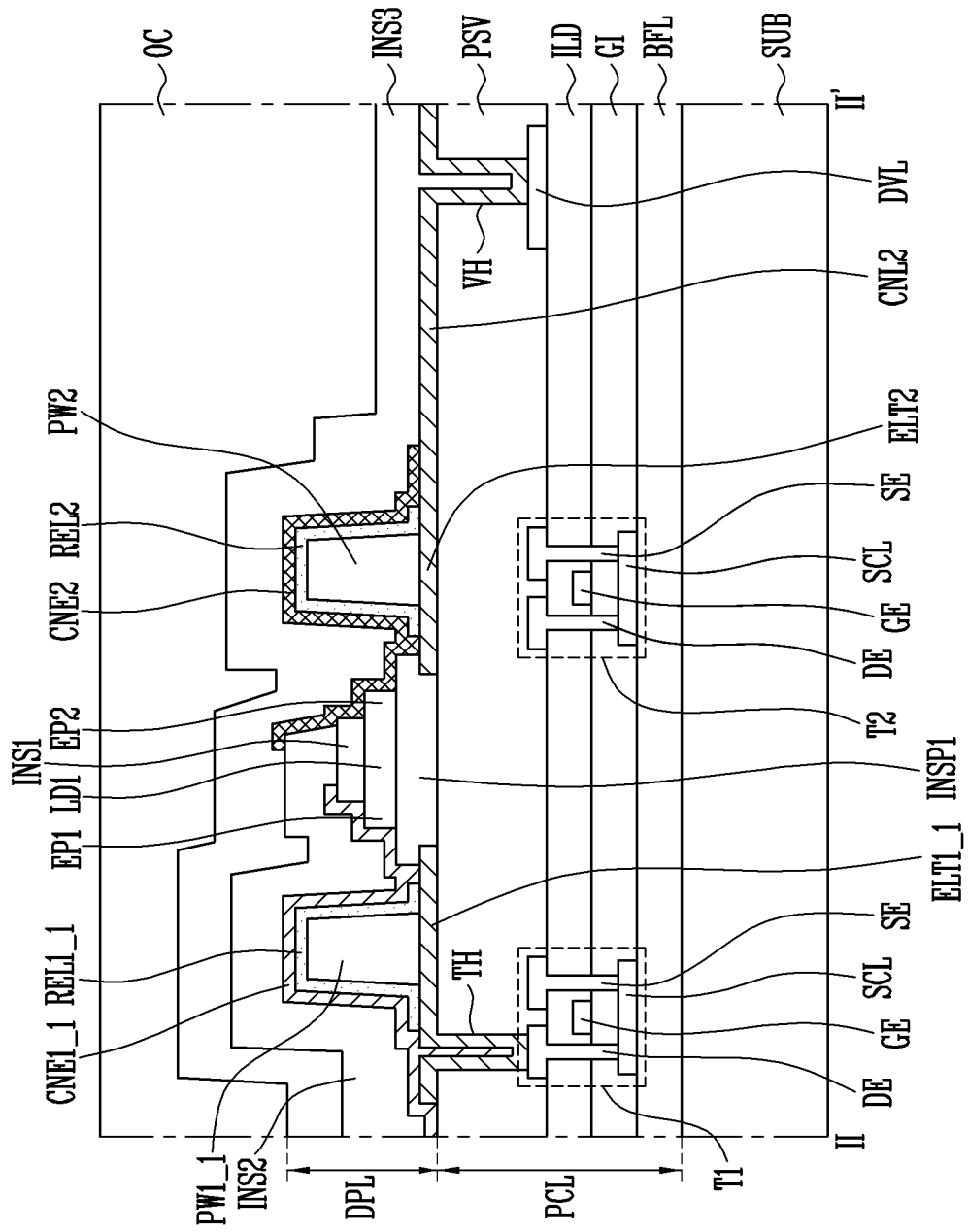
FIG. 9A is a schematic sectional diagram taken along line II-II' of FIG. 8.
Figure 9B:
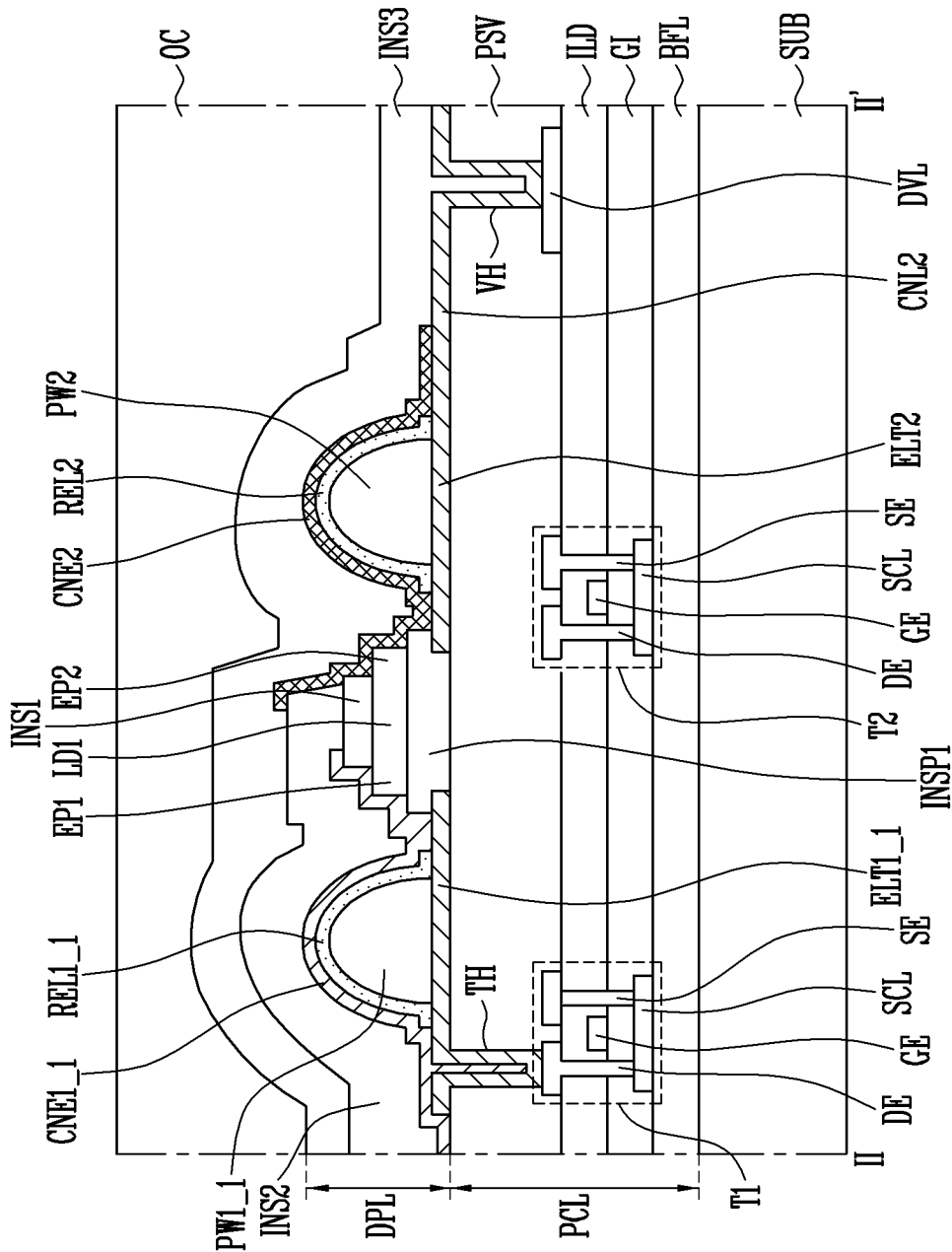
FIG. 9B illustrates a display device in accordance with an embodiment of the disclosure and is a schematic sectional diagram corresponding to line II-II' of FIG. 8.

FIG. 8 is a plan diagram schematically illustrating first to third sub-pixels included in one of pixels illustrated in FIG. 6. FIG. 9A is a schematic sectional diagram taken along line II-II' of FIG. 8. FIG. 9B illustrates a display device in accordance with an embodiment of the disclosure and is a schematic sectional diagram corresponding to line II-II' of FIG. 8.

In an embodiment of the disclosure, the following description will be focused on differences from the foregoing embodiments to avoid repetitive explanation. Components which are not separately explained in the following description of the embodiment comply with that of the foregoing embodiments. The same reference numeral will be used to designate the same component, and a similar reference numeral will be used to designate a similar component.

In FIG. 8, for the sake of explanation, light emitting elements provided in each sub-pixel are illustrated as being horizontally arranged. However, the arrangement of the light emitting elements is not limited thereto. For example, at least some of the light emitting elements may be arranged in a direction intersecting the horizontal direction.

For the sake of explanation, illustration of transistors electrically connected to the light emitting elements, and signal lines electrically connected to the transistors has been omitted in FIG. 8. In FIG. 8, the unit emission area may be a pixel area of one sub-pixel.

Referring to FIGS. 1A to 9B, the display device in accordance with an embodiment of the disclosure may include a substrate SUB on which pixels PXL are provided.

Each of the pixels PXL may include a first sub-pixel SP1, a second sub-pixel SP2, and a third sub-pixel SP3, which are provided on the substrate SUB.

The unit emission area 100 of each of the first to third sub-pixels SP1, SP2, and SP3 may include the substrate SUB, a pixel circuit layer PCL provided on the substrate SUB, and a display element layer DPL provided on the pixel circuit layer PCL.

The pixel circuit layer PCL may include a buffer layer BFL disposed on the substrate SUB, first and second transistors T1 and T2 disposed on the buffer layer BFL, and a driving voltage line DVL. The pixel circuit layer PCL may further include a passivation layer PSV which is provided on the first and second transistors T1 and T2 and the driving voltage line DVL.

The display element layer DPL may include first and second electrodes ELT1 and ELT2, first and second partition walls PW1 and PW2, first and second reflective electrodes REL1 and REL2, first and second connection lines CNL1 and CNL2, light emitting elements LD, and first and second contact electrodes CNE1 and CNE2 which are provided on the passivation layer PSV.

For the sake of convenience, the display element layer DPL will be described after the pixel circuit layer PCL is described.

The substrate SUB may include an insulating material such as glass, an organic polymer, or crystal. The substrate SUB may be made of material having flexibility so as to be bendable or foldable and may have a single-layer or multi-layer structure.

The buffer layer BFL may be provided on the substrate SUB and may prevent impurities from diffusing into the first and second transistors T1 and T2. The buffer layer BFL may be provided in a single-layer structure or a multi-layer structure having at least two or more layers. In the case where the buffer layer BFL has a multi-layer structure, the respective layers may be formed of the same material or different materials. The buffer layer BFL may be omitted depending on the material of the substrate SUB or processing conditions.

The first transistor T1 may be a driving transistor which is electrically connected to some of the light emitting elements LD provided in the display element layer DPL to drive the corresponding light emitting element LD. The second transistor T2 may be a switching transistor that switches the first transistor T1.

Each of the first and second transistors T1 and T2 may include a semiconductor layer SCL, a gate electrode GE, a drain electrode DE, and a source electrode SE.

The semiconductor layer SCL may be disposed on the buffer layer BFL. The semiconductor layer SCL may include a first area which comes into contact with the drain electrode DE, and a second area which comes into contact with the source electrode SE. An area between the first area and the second area may be a channel area. In an embodiment of the disclosure, the first area may be any one of a source area and a drain area, and the second area may be the other area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the first area and the second area may be a semiconductor pattern doped with impurities.

The gate electrode GE may be provided on the semiconductor layer SCL with a gate insulating layer GI interposed therebetween.

The drain electrode DE and the source electrode SE may respectively come into contact with the first area and the second area of the semiconductor layer SCL through corresponding contact holes that pass through an interlayer insulating layer ILD and the gate insulating layer GI.

The driving voltage line DVL may be provided on the interlayer insulating layer ILD, but it is not limited thereto. In some embodiments, the driving voltage line DVL may be provided on any one of insulating layers included in the pixel circuit layer PCL. The second driving power VSS may be applied to the driving voltage line DVL.

The passivation layer PSV may include a through hole TH in which the drain electrode DE of the first transistor T1 is exposed, and a via hole VH in which the driving voltage line DVL is exposed.

The first and second electrodes ELT1 and ELT2 may be disposed on the passivation layer PSV and spaced apart from each other by a predetermined distance.

The first electrode ELT1 and the second electrode ELT2 may align the light emitting elements LD in the unit emission area 100 of each of the first to third sub-pixels SP1 to SP3. To this end, the first electrode ELT1 may be electrically connected to the first alignment line ARL1 through the first connection line CNL1 extending in the first direction DR1 of the substrate SUB. The second electrode ELT2 may be electrically connected to the second alignment line ARL2 through the second connection line CNL2 extending in a direction parallel to the first connection line CNL1.

If the alignment of the light emitting elements LD is completed, the first alignment line ARL1 and the first electrode ELT1 may be electrically disconnected from each other, and the second alignment line ARL2 and the second electrode ELT2 may also be electrically disconnected from each other.

In an embodiment of the disclosure, the first electrode ELT1 may be electrically connected to the drain electrode DE of the first transistor T1 through the through hole TH of the passivation layer PSV. Hence, a signal supplied to the first transistor T1 may be transmitted to the first electrode ELT1. The signal transmitted to the first electrode ELT1 may be transmitted to the first reflective electrode REL1 through the first electrode ELT1.

The second electrode ELT2 may be electrically connected with the driving voltage line DVL through the via hole VH of the passivation layer PSV. Consequently, the second driving power VSS of the driving voltage line DVL may be transmitted to the second electrode ELT2. The second driving power VSS transmitted to the second electrode ELT2 may be transmitted to the second reflective electrode REL2 through the second electrode ELT2.

In an embodiment, the drain electrode DE of the first transistor T1 may be directly electrically connected to the first reflective electrode REL1 through the through hole TH. The driving voltage line DVL may be directly electrically connected to the second reflective electrode REL2 through the via hole VH. In this case, a signal supplied to the first transistor T1 may be directly transmitted to the first reflective electrode REL1. The second driving power VSS of the driving voltage line DVL may be directly transmitted to the second reflective electrode REL2. An embodiment in which the drain electrode DE of the first transistor T1 and the first reflective electrode REL1 are directly electrically connected to each other and the driving voltage line DVL and the second reflective electrode REL2 are directly electrically connected to each other will be described below with reference to FIG. 10.

The first electrode ELT1 may include a 1-1-th electrode ELT1_1 and a 1-2-th electrode ELT1_2 with the second electrode ELT2 interposed therebetween.

The 1-1-th electrode ELT1_1 and the 1-2_th electrode ELT1_2 may diverge from the first connection line CNL1 in a second direction DR2 intersecting the first direction DR1.

The 1-1-th electrode ELT1_1, the 1-2_th electrode ELT1_2, and the first connection line CNL1 may be integrally provided on the passivation layer PSV of the pixel circuit layer PCL and electrically and/or physically connected to each other, but the disclosure is not limited thereto. For example, the 1-1-th and 1-2-th electrodes ELT1_1 and ELT1_2 and the first connection line CNL1 may be provided on different layers and electrically connected to each other through a separate contact unit (e.g., a contact hole and/or a contact electrode).

The second electrode ELT2 may diverge from the second connection line CNL2 and extend in the second direction DR2. The second electrode ELT2 and the second connection line CNL2 may be integrally provided on the passivation layer PSV of the pixel circuit layer PCL and electrically and/or physically connected to each other, but the disclosure is not limited thereto. For example, the second electrode ELT2 and the second connection line CNL2 may be provided on different layers and electrically connected to each other through a separate contact unit.

The display element layer DPL may further include a first insulating pattern INSP1 disposed between the 1-1-th electrode ELT1_1 and the second electrode ELT2, and a second insulating pattern INSP2 disposed between the second electrode ELT2 and the 1-2-th electrode ELT1_2.

Each of the first insulating pattern INSP1 and the second insulating pattern INSP2 may include any one of an inorganic insulating layer including inorganic material, or an organic insulating layer including organic material.

The first insulating pattern INSP1 may overlap a first side of the 1-1-th electrode ELT1_1 and a first side of the second electrode ELT2. The second insulating pattern INSP2 may overlap a second side of the second electrode ELT2 and a first side of the 1-2-th electrode ELT1_2.

In an embodiment of the disclosure, a thickness d of each of the first and second insulating pattern INSP1 and INSP2 may range from about 0 nm to about 300 nm. Furthermore, a width W1 of each of the first and second insulating patterns INSP1 and INSP2 with respect to a lateral direction (e.g., the first direction DR1) may be greater than a length L of each of the light emitting elements LD. The second insulating pattern INSP2 and the first insulating pattern INSP1 may have the same structure.

The light emitting elements LD may be aligned on each of the first insulating pattern INSP1 and the second insulating pattern INSP2.

As illustrated in FIG. 1A, each of the light emitting elements LD may include a first conductive semiconductor layer 11, a second conductive semiconductor layer 13, an active layer 12 interposed between the first and second conductive semiconductor layers 11 and 13, and an upper electrode layer 15 provided on the second conductive semiconductor layer 13.

Each of the light emitting elements LD may include a first end EP1 and a second end EP2.

The light emitting elements LD may include first light emitting elements LD1 aligned on the first insulating pattern INSP1, and second light emitting elements LD2 aligned on the second insulating pattern INSP2.

The first partition wall PW1 and the second partition wall PW2 may define a unit emission area 100 of each of the first to third sub-pixels SP1 to SP3.

The first partition wall PW1 may be provided on the first electrode ELT1, and the second partition wall PW2 may be provided on the second electrode ELT2. The first partition wall PW1 and the second partition wall PW2 may be disposed on the same plane and spaced apart from each other by a predetermined distance.

As illustrated in FIG. 9A, each of the first partition wall PW1 and the second partition wall PW2 may have a trapezoidal shape having sides inclined at a predetermined angle, but the disclosure is not limited thereto. In some embodiments, as illustrated in FIG. 9B, each of the first and second partition walls PW1 and PW2 may have a curved surface having a cross-sectional shape such as a semi-circle, or a semi-ellipse, the width of which reduces from one surface of the passivation layer PSV toward an upper end of the curved surface, but the disclosure is not limited.

The shape of each of the first and second partition walls PW1 and PW2 may be changed in various ways within a range in which the efficiency of light emitted from the light emitting elements LD can be enhanced.

Each of first partition wall PW1 and the second partition wall PW2 may have a height h greater than the length L of each of the light emitting elements LD.

The first reflective electrode REL1 and the second reflective electrode REL2 may reflect light emitted from the opposite ends EP1 and EP2 of each of the light emitting elements LD in a direction in which an image is of the display device is displayed (e.g., in a frontal direction).

The first reflective electrode REL1 may be provided on the first partition wall PW1, and the second reflective electrode REL2 may be provided on the second partition wall PW2. Each of the first reflective electrode REL1 and the second reflective electrode REL2 may have a shape corresponding to the shape of the corresponding partition wall.

For example, in the case where each of the first and second partition walls PW1 and PW2 has a trapezoidal shape as illustrated in FIG. 9A, each of the first and second reflective electrodes REL1 and REL2 may have a protrusion having an inclination corresponding to the trapezoidal shape.

In an embodiment, in the case where each of the first and second partition walls PW1 and PW2 has a semi-elliptical shape as illustrated in FIG. 9B, each of the first and second reflective electrodes REL1 and REL2 may have a protrusion having a curvature corresponding to the semi-elliptical shape.

The first reflective electrode REL1 and the second reflective electrode REL2 may be disposed on the same plane and spaced apart from each other by a predetermined distance. In an embodiment of the disclosure, a width W3 between the first reflective electrode REL1 and the second reflective electrode REL2 may be greater than a width W1 of each of the first and second insulating pattern INSP1 and INSP2 with respect to the lateral direction.

The first reflective electrode REL1 may be disposed adjacent to one end of the opposite ends EP1 and EP2 of each of the light emitting elements LD and may be electrically connected to each of the light emitting elements LD through the first contact electrode CNE1. The second reflective electrode REL2 may be disposed adjacent to the other end of the opposite ends EP1 and EP2 of each of the light emitting elements LD and may be electrically connected to each of the light emitting elements LD through the second contact electrode CNE2.

The first reflective electrode REL1 may be electrically connected with the first electrode ELT1. Therefore, a signal of the first transistor T1 that is transmitted to the first electrode ELT1 may be transmitted to the first reflective electrode REL1. The signal of the first transistor T1 that is transmitted to the first reflective electrode REL1 may be transmitted to the one end of the opposite ends EP1 and EP2 of each of the light emitting elements LD through the first contact electrode CNE1.

The second reflective electrode REL2 may be electrically connected with the second electrode ELT2. Therefore, the second driving power VSS transmitted to the second electrode ELT2 may be transmitted to the second reflective electrode REL2. The second driving power VSS transmitted to the second reflective electrode REL2 may be transmitted to the other end of the opposite ends EP1 and EP2 of each of the light emitting elements LD through the second contact electrode CNE2.

As described above, if predetermined voltages are applied to the opposite ends EP1 and EP2 of each of the light emitting elements LD, each of the light emitting elements LD may emit light by coupling of electron-hole pairs in the active layer 12 of the light emitting element LD. Light emitted from the opposite ends EP1 and EP2 of each of the light emitting elements LD may be moved to the first reflective electrode REL1 and the second reflective electrode REL2 and reflected in the frontal direction. Hence, the display device may display an image corresponding to the light.

As described above, after the light emitting elements LD are aligned in the unit emission area 100 of a corresponding sub-pixel, the first and second partition walls PW1 and PW2 are provided. Therefore, in the display device in accordance with an embodiment of the disclosure, alignment defects of the light emitting elements LD may be minimized.

In the display device in accordance with an embodiment of the disclosure, the first and second partition walls PW1 and PW2 may be designed in various shapes without being restricted by alignment conditions of the light emitting elements LD, whereby the efficiency of light emitted from the opposite ends EP1 and EP2 of each of the light emitting elements LD can be further enhanced.

Figure 10:
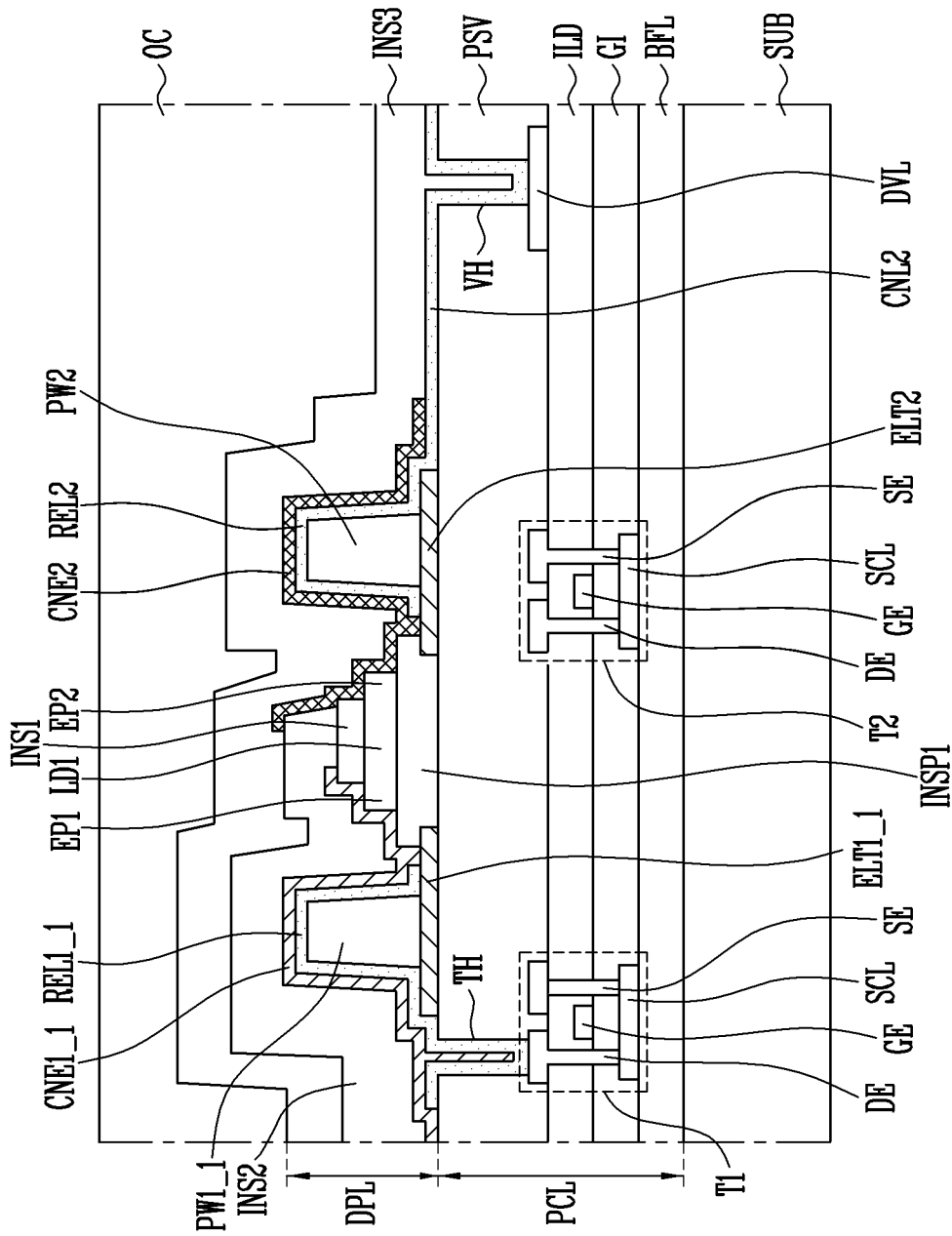
FIG. 10 is a schematic sectional diagram illustrating a portion of the display device of embodiment of FIG. 6.

FIG. 10 is a schematic sectional diagram illustrating a portion of the display device of an embodiment of FIG. 6. In the embodiment, the following description will be focused on differences from the foregoing embodiments to avoid repetitive explanation. Components which are not separately explained in the following description of the embodiment may comply with that of the foregoing embodiments. The same reference numeral will be used to designate the same component, and a similar reference numeral will be used to designate a similar component.

The structure of the display device illustrated in FIG. 10, other than the structure that a first reflective electrode may be directly electrically connected to a first transistor of a pixel circuit layer and the second reflective electrode may be directly electrically connected to a driving voltage line, may be substantially identical or similar to that of the display device of FIGS. 8 and 9A.

Referring to FIGS. 1A, 6, 8, and 10, the display device in accordance with an embodiment of the disclosure may include a substrate SUB, a pixel circuit layer PCL provided on the substrate SUB, and a display element layer DPL provided on the pixel circuit layer PCL.

The pixel circuit layer PCL may include a buffer layer BFL disposed on the substrate SUB, first and second transistors T1 and T2 disposed on the buffer layer BFL, and a driving voltage line DVL. The pixel circuit layer PCL may further include a passivation layer PSV which covers the first and second transistors T1 and T2 and the driving voltage line DVL.

The passivation layer PSV may include a through hole TH in which a portion of the drain electrode DE of the first transistor T1 is exposed, and a via hole VH in which a portion of the driving voltage line DVL is exposed.

The display element layer DPL may include first and second electrodes ELT1 and ELT2, first and second insulating patterns INSP1 and INSP2, first and second partition walls PW1 and PW2, first and second reflective electrodes REL1 and REL2, first and second connection lines CNL1 and CNL2, light emitting elements LD, and first and second contact electrodes CNE1 and CNE2.

The first electrode ELT1 and the second electrode ELT2 may be provided on the passivation layer PSV and spaced apart from each other by a predetermined distance.

As alignment voltages are respectively applied to the first electrode ELT1 and the second electrode ELT2, an electric field may be formed between the first electrode ELT1 and the second electrode ELT2. The light emitting elements LD may be aligned between the first electrode ELT1 and the second electrode ELT2 by the electric field.

The first partition wall PW1 and the second partition wall PW2 may be provided on corresponding electrodes after the light emitting elements LD are aligned. The first partition wall PW1 may be provided on the first electrode ELT1, and the second partition wall PW2 may be provided on the second electrode ELT2.

The first reflective electrode REL1 may be provided on the first partition wall PW1 and electrically connected with the first electrode ELT1. The second reflective electrode REL2 may be provided on the second partition wall PW2 and electrically connected with the second electrode ELT2.

In an embodiment of the disclosure, the first reflective electrode REL1 may be an anode electrode of each of the light emitting elements LD, and the second reflective electrode REL2 may be a cathode electrode of each of the light emitting elements LD.

The first reflective electrode REL1 may be electrically connected to the drain electrode DE of the first transistor T1 through the through hole TH of the passivation layer PSV. In this case, a signal of the first transistor T1 may be transmitted to the first reflective electrode REL1 and be transmitted to one end of the opposite ends EP1 and EP2 of each of the light emitting elements LD through the first contact electrode CNE1.

The second reflective electrode REL2 may be electrically connected with the driving voltage line DVL through the via hole VH of the passivation layer PSV. In this case, second driving power (refer to VSS of FIG. 7A) of the driving voltage line DVL may be transmitted to the second reflective electrode REL2 and be transmitted to the other end of the opposite ends EP1 and EP2 of each of the light emitting elements LD through the second contact electrode CNE2.

As described above, if predetermined voltages are applied to the opposite ends EP1 and EP2 of each of the light emitting elements LD, each of the light emitting elements LD may emit light by coupling of electron-hole pairs in the active layer 12 of the light emitting element LD. Light emitted from the opposite ends EP1 and EP2 of each of the light emitting elements LD may be moved to the first reflective electrode REL1 and the second reflective electrode REL2 and reflected in the frontal direction. Hence, the display device may display an image corresponding to the light.

The display device in accordance with an embodiment of the disclosure may be employed in various electronic devices. For instance, the display device may be applied to a television, a notebook computer, a cellular phone, a smartphone, a smartpad, a portable multimedia player (PMP), a personal digital assistant (PDA), a navigation device, various kinds of wearable devices such as a smartwatch, etc.

While various exemplary embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the claimed invention shall be defined by the accompanying claims.

The invention claimed is:

1. A light emitting device comprising:
    a first electrode disposed on a substrate;
    a second electrode spaced apart from the first electrode, the first electrode and the second electrode being disposed on a same layer;
    an insulating pattern disposed between the first electrode and the second electrode and overlapping a portion of the first electrode and a portion of the second electrode in a plan view;
    at least one light emitting element disposed on the insulating pattern, and including a first end and a second end in a longitudinal direction of the at least one light emitting element;
    a first bank disposed on the first electrode, and a second bank disposed on the second electrode;
    a first reflective electrode disposed on the first bank and electrically connected with the first electrode; and
    a second reflective electrode disposed on the second bank and electrically connected with the second electrode, wherein
    in a plan view, the insulating pattern has a width greater than a length of the at least one light emitting element.

2. The light emitting device according to claim 1, wherein, in a plan view, the insulating pattern is disposed between the first bank and the second bank which are spaced apart from each other.

3. The light emitting device according to claim 2, wherein a height of each of the first bank and the second bank is equal to or greater than the length of the at least one light emitting element.

4. The light emitting device according to claim 2, wherein the width of the insulating pattern is less than a distance between the first reflective electrode and the second reflective electrode and greater than the distance between the first electrode and the second electrode.

5. The light emitting device according to claim 2, wherein the first reflective electrode and the second reflective electrode are disposed on a same layer and spaced apart from each other.

6. The light emitting device according to claim 2, further comprising:
    a first contact electrode disposed on the first reflective electrode, the first contact electrode electrically connecting the first end of the at least one light emitting element with the first reflective electrode; and
    a second contact electrode disposed on the second reflective electrode, the second contact electrode electrically connecting the second end of the at least one light emitting element with the second reflective electrode.

7. The light emitting device according to claim 2, wherein the at least one light emitting element comprises:
    a first semiconductor layer doped with a first conductive dopant;
    a second semiconductor layer doped with a second conductive dopant; and
    an active layer disposed between the first semiconductor layer and the second semiconductor layer.

8. The light emitting device according to claim 7, wherein the at least one light emitting element includes a light emitting diode having a shape of a cylinder or polyprism and having a micro-scale or nano-scale size.

9. The light emitting device according to claim 1, wherein
    the first end of each of the at least one light emitting element is spaced apart from the substrate by a first distance,
    the second end of each of the at least one light emitting element is spaced apart from the substrate by a second distance, and
    the first distance and the second distance are equal.

10. The light emitting device according to claim 1, further comprising:
    a first contact electrode disposed on the first reflective electrode, the first contact electrode electrically connecting the first end of the at least one light emitting element with the first reflective electrode; and
    a second contact electrode disposed on the second reflective electrode, the second contact electrode electrically connecting the second end of the at least one light emitting element with the second reflective electrode.

11. The light emitting device according to claim 1, wherein
    the first electrode is disposed between the first bank and the substrate, and
    the second electrode is disposed between the second bank and the substrate.

12. The light emitting device according to claim 10, wherein the first bank is disposed between the first electrode and each of the first reflective electrode and the first contact electrode, and the second bank is disposed between the second electrode and each of the second reflective electrode and the second contact electrode.

13. The light emitting device according to claim 1, wherein the insulating pattern has a bar shape in a plan view, and the insulating pattern has a flat upper surface that is parallel to an upper surface of the substrate.

14. The light emitting device according to claim 7, wherein the at least one light emitting element further includes an insulating film enclosing at least a portion of an outer circumferential surface of the first semiconductor layer, the active layer and the second semiconductor layer, the insulating film being selected from $SiO_2$, $Si_3N_4$, $Al_2O_3$, and $TiO_2$, and the insulating pattern being an organic insulating layer comprised of an organic material.

* * * * *